(12) United States Patent
Lin et al.

(10) Patent No.: US 9,098,291 B1
(45) Date of Patent: Aug. 4, 2015

(54) TRANSFORMING MODELING ENVIRONMENT CODE/MODEL INTO A NON-MODELING ENVIRONMENT FORMAT

(71) Applicant: The MathWorks, Inc., Natick, MA (US)

(72) Inventors: Xiaocang Lin, Sherborn, MA (US); Jesung Kim, Newton, MA (US); Yong Huang, Sudbury, MA (US)

(73) Assignee: The MathWorks, Inc., Natick, MA (US)

( * ) Notice: Subject to any disclaimer, the term of this patent is extended or adjusted under 35 U.S.C. 154(b) by 260 days.

(21) Appl. No.: 13/693,525

(22) Filed: Dec. 4, 2012

(51) Int. Cl.
G06F 9/44 (2006.01)

(52) U.S. Cl.
CPC .......................................... *G06F 8/35* (2013.01)

(58) Field of Classification Search
None
See application file for complete search history.

(56) References Cited

U.S. PATENT DOCUMENTS

| | | | |
|---|---|---|---|
| 7,487,447 B1 * | 2/2009 | Jerger | 715/252 |
| 7,644,390 B2 * | 1/2010 | Khodabandehloo et al. | 717/105 |
| 7,835,895 B1 * | 11/2010 | Orofino et al. | 703/13 |
| 7,849,394 B2 * | 12/2010 | Tuschner et al. | 715/205 |
| 7,865,350 B1 * | 1/2011 | Tocci et al. | 703/22 |
| 7,945,431 B1 * | 5/2011 | Mukherjee et al. | 703/2 |
| 8,046,708 B1 | 10/2011 | Aldrich | |
| 8,104,017 B2 * | 1/2012 | Lin et al. | 717/107 |
| 8,122,354 B1 * | 2/2012 | Torgerson | 715/710 |
| 8,321,847 B1 * | 11/2012 | Garvin et al. | 717/143 |
| 8,694,953 B2 * | 4/2014 | Khodabandehloo et al. | 717/105 |
| 2005/0229154 A1 * | 10/2005 | Hiew et al. | 717/110 |
| 2006/0064670 A1 * | 3/2006 | Linebarger et al. | 717/106 |
| 2006/0242207 A1 * | 10/2006 | Tsyganskiy et al. | 707/203 |
| 2007/0266368 A1 * | 11/2007 | Szpak et al. | 717/105 |
| 2008/0098349 A1 * | 4/2008 | Lin et al. | 717/106 |

* cited by examiner

*Primary Examiner* — Don Wong
*Assistant Examiner* — Roberto E Luna
(74) *Attorney, Agent, or Firm* — Harrity & Harrity, LLP

(57) ABSTRACT

A device receives code in a modeling environment format, receives a model in the modeling environment format, and receives relationships information associated with one or more relationships between the code and the model. The device combines the code, the model, and the relationships information to generate an output file in a non-modeling environment format, and outputs or stores the output file.

39 Claims, 19 Drawing Sheets

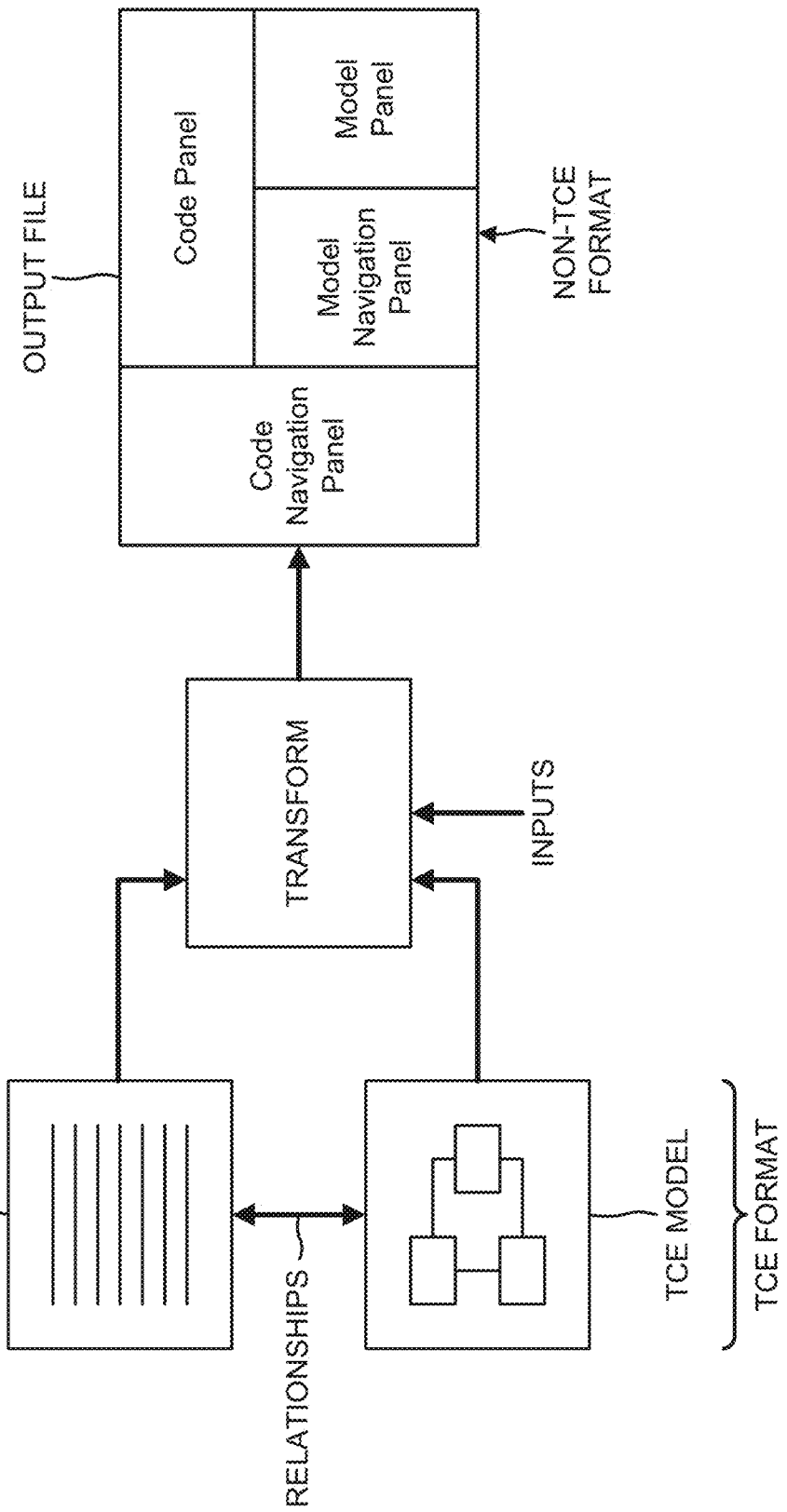

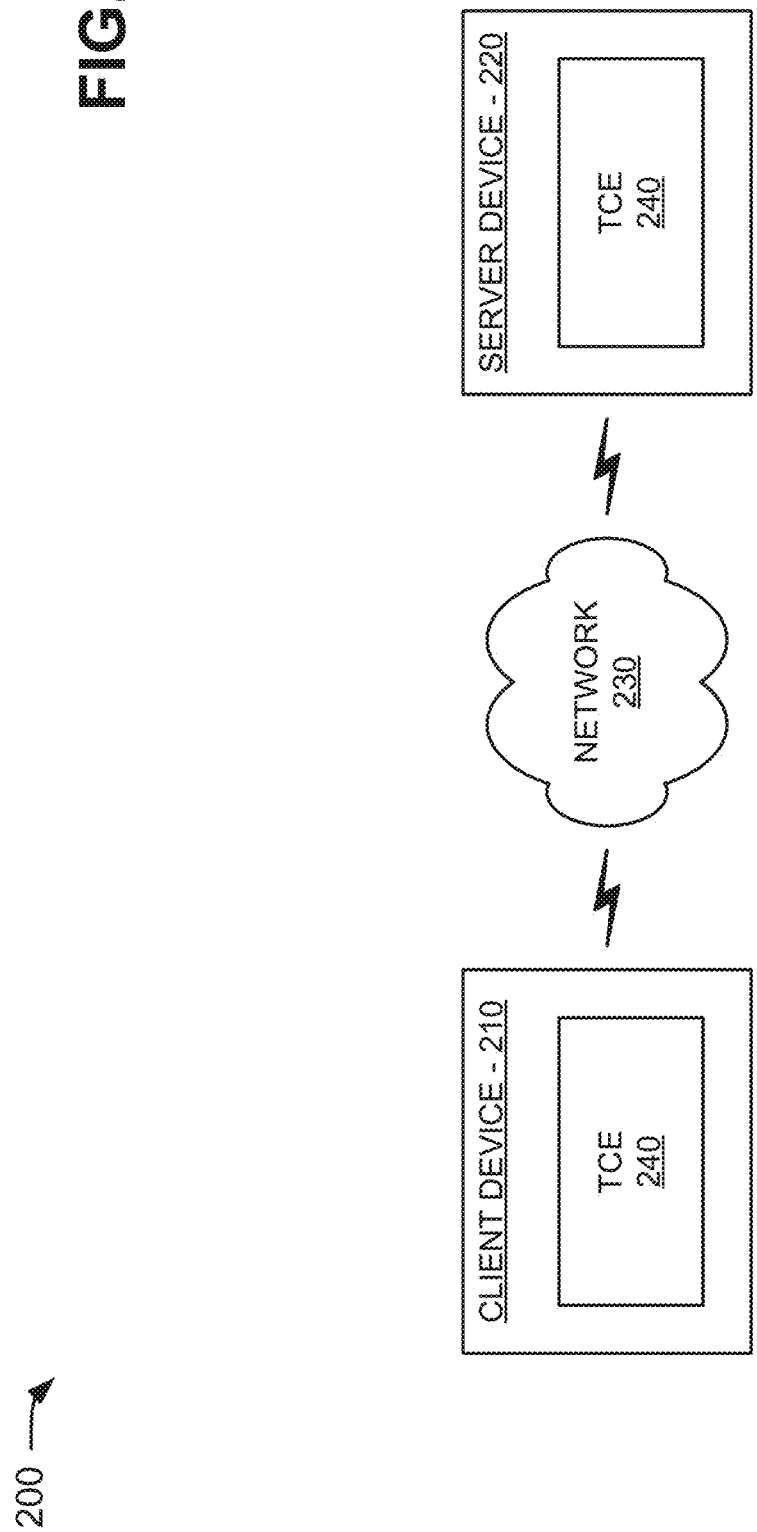

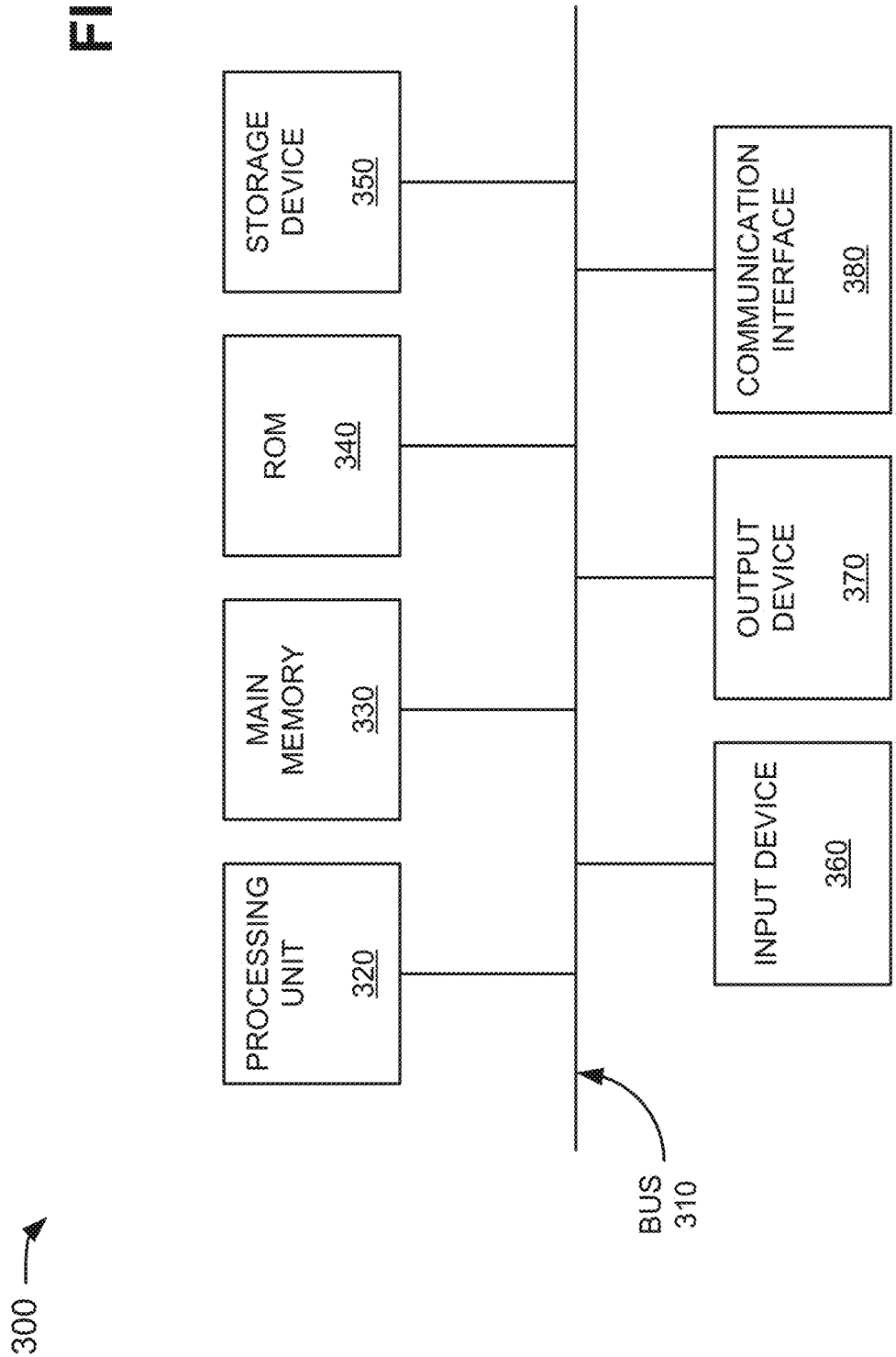

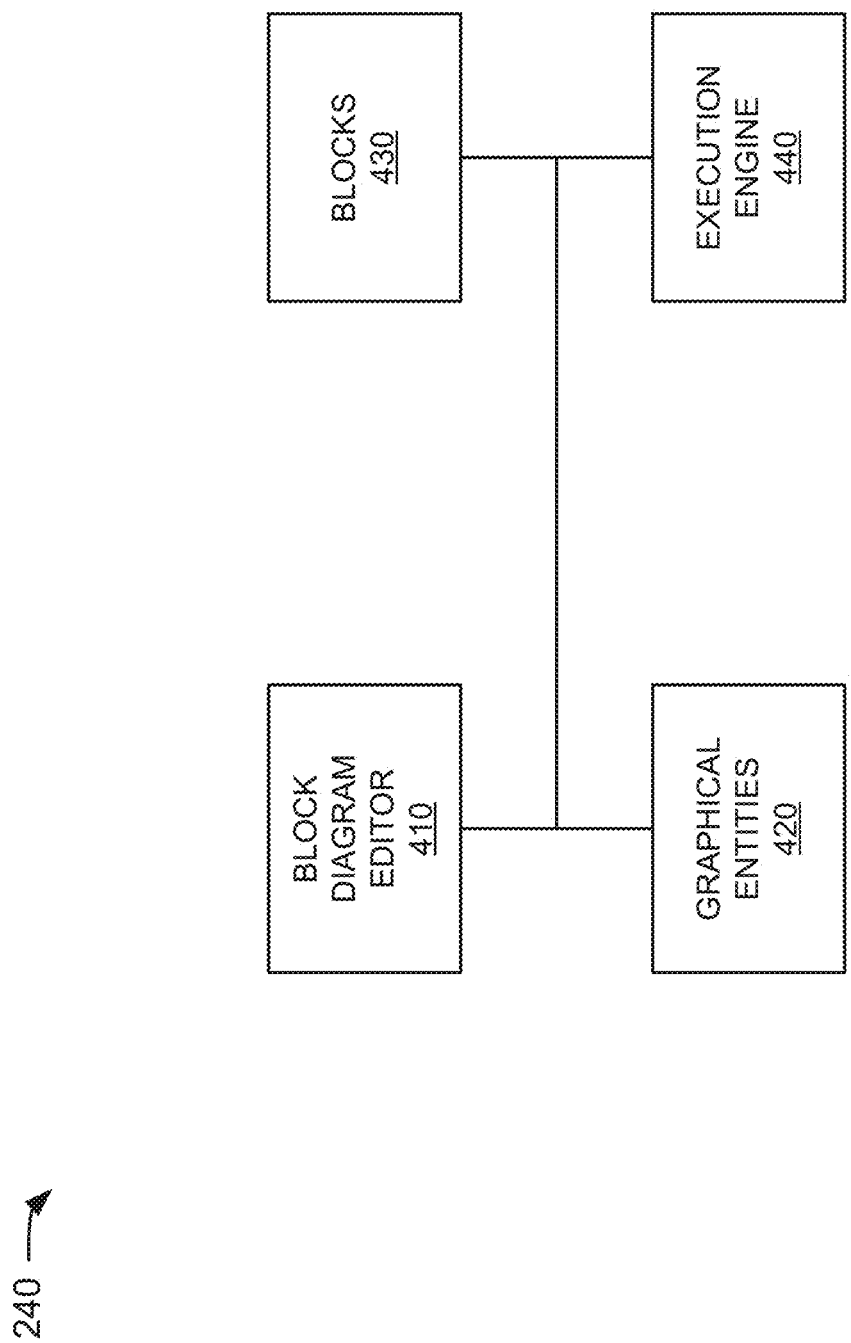

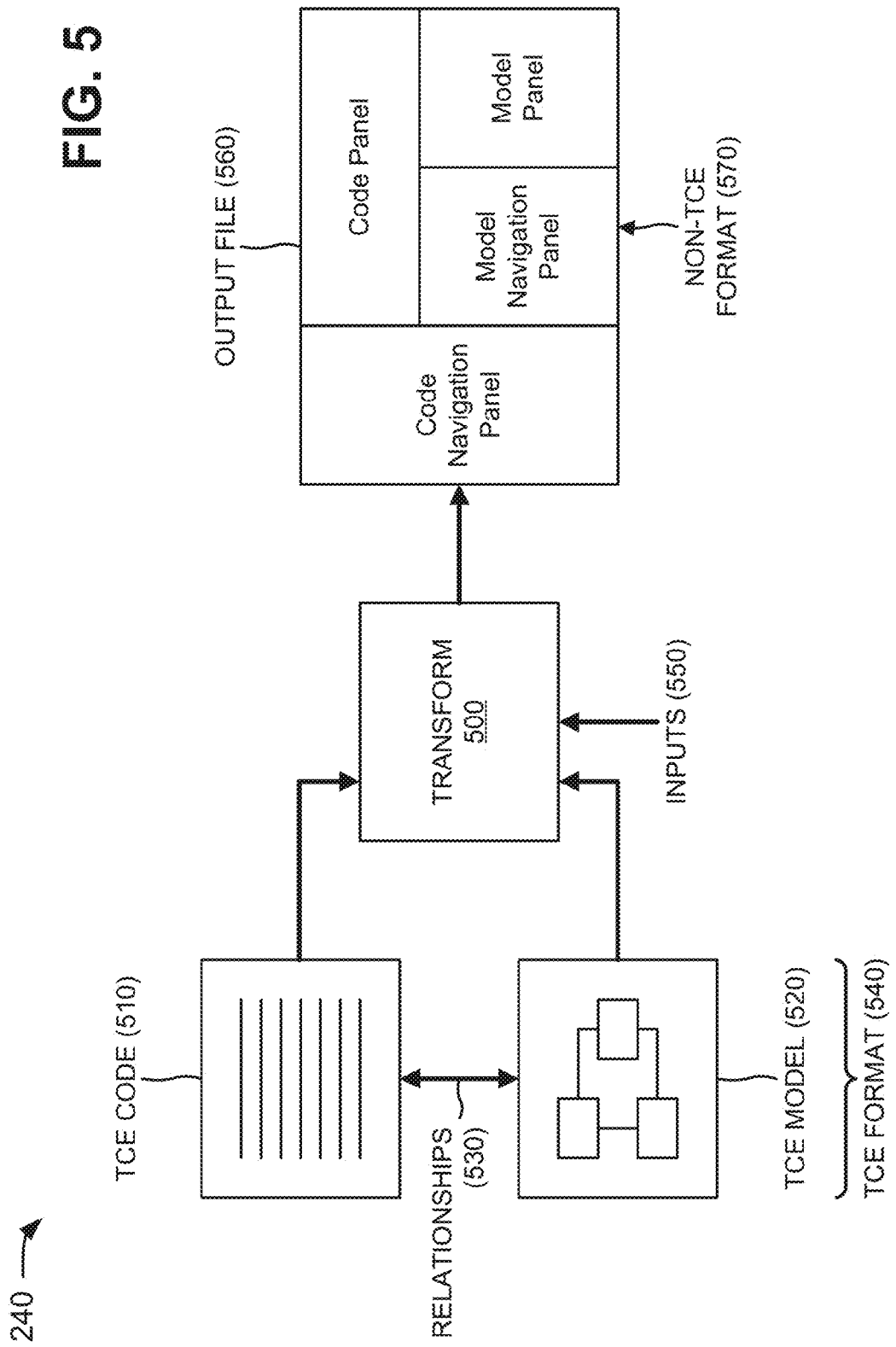

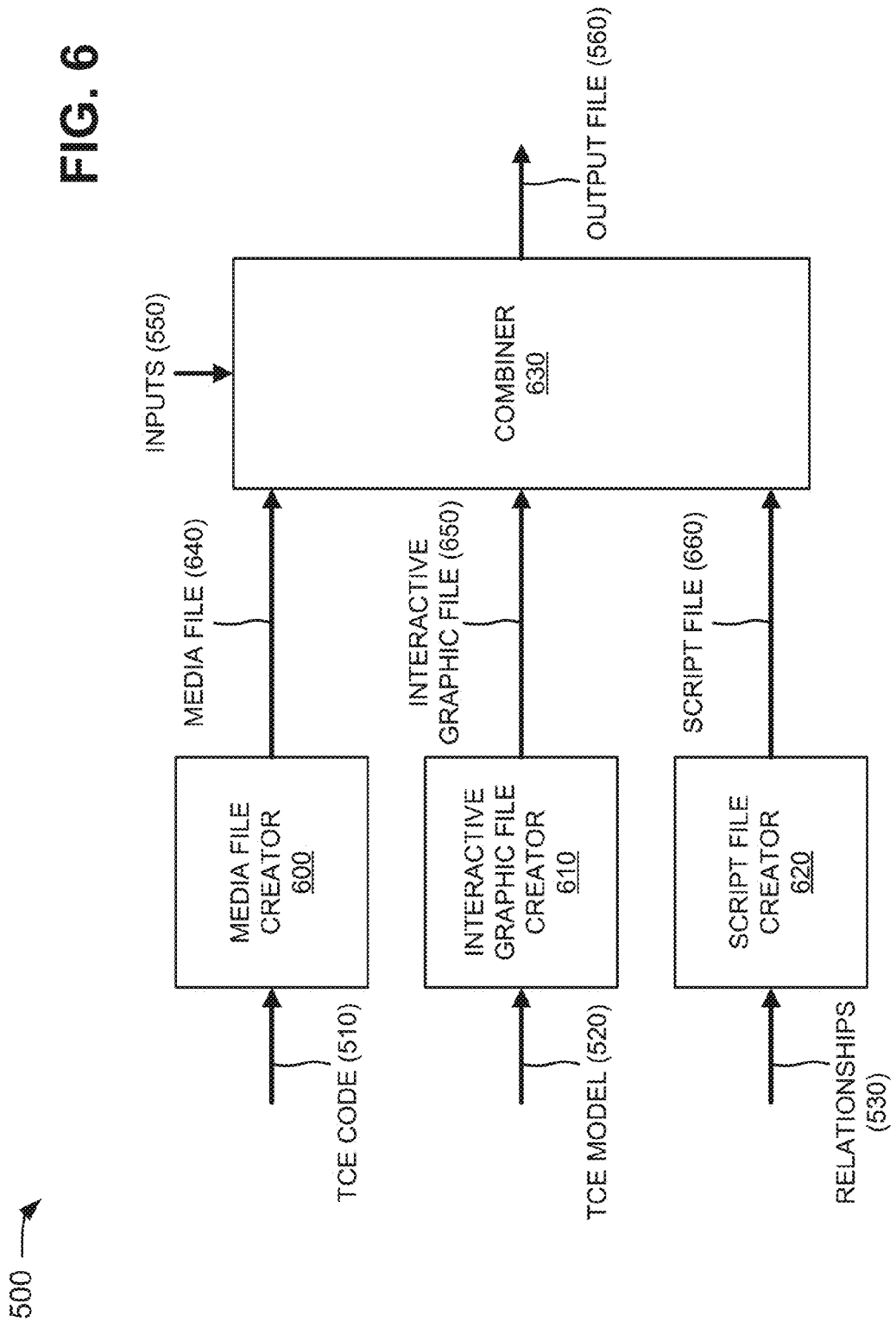

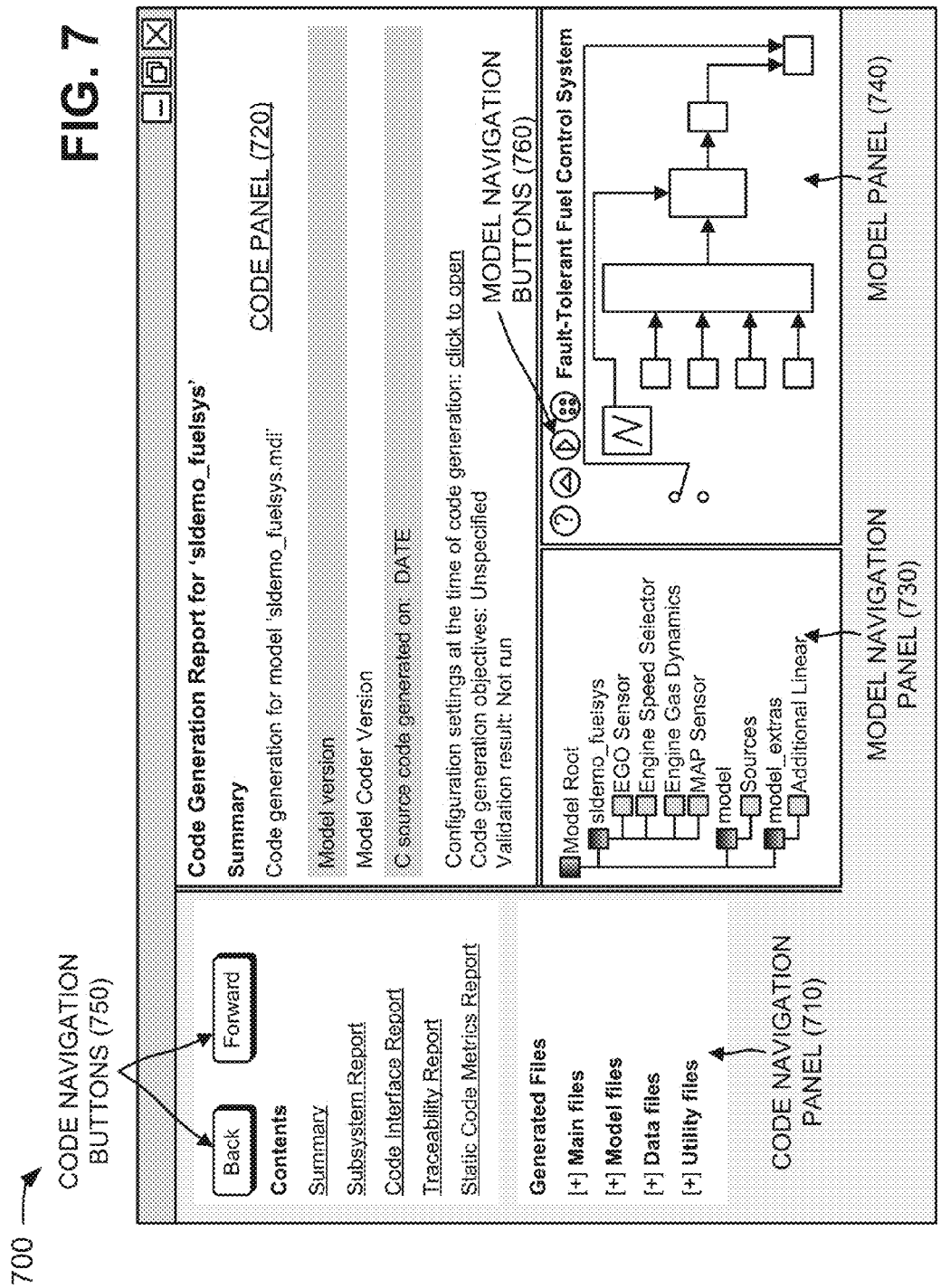

FIG. 8B

```
876    rtDWork.RateTransition.throttle = rtb_throttle_d;
877    rtDWork.RateTransition.speed = 300.0F;
878    rtDWork.RateTransition.ego = rtb_ego_a;
879    rtDWork.RateTransition.map = (real32_T)rtDwork.p00589bar;
880    }
881    /* End of RateTransition: '<S8>/Rate_Transition' */
882    if (rtmIsMajorTimeStep(rtM) &&
883        rtM->Timing.TaskCounters.TID[2] == 0) {
884        /* Outputs for Atomic Subsystem: '<Root>/fuel_rate_control'     HIGHLIGHTED (820)
885        * Chart: '<S10>/control_logic'
886        *
887
```

720

740 Fuel Rate Control Subsystem

730
- Model Root
  - sldemo_fuelsys
  - EGO Sensor
  - Engine Speed Selector
  - Engine Gas Dynamics
  - MAP Sensor
  - Speed Sensor
  - fuel_rate_control
  - airflow_calc

HIGHLIGHTED (840)

[Back] [Forward]

Contents
Summary
Subsystem Report
Code Interface Report
Traceability Report
Static Code Metrics Report

Generated Files
[+] Main files
[+] Model files
    sldemo_fuelsys.c  710
[+] Data files
[+] Utility files

HIGHLIGHTED (830)

TRANSFORMING MODELING ENVIRONMENT CODE/MODEL INTO A NON-MODELING ENVIRONMENT FORMAT

BRIEF DESCRIPTION OF THE DRAWINGS

The accompanying drawings, which are incorporated in and constitute a part of this specification, illustrate one or more implementations and, together with the description, explain these implementations. In the drawings:

FIG. 1 is a diagram of an overview of an example implementation described herein;

FIG. 2 is a diagram of an example environment in which systems and/or methods described herein may be implemented;

FIG. 3 is a diagram of example components of one or more of the devices of the environment depicted in FIG. 2;

FIG. 4 is a diagram of example functional components of a technical computing environment (TCE) that may be used by one or more of the devices of the environment depicted in FIG. 2;

FIG. 5 is a diagram of example operations capable of being performed by the TCE;

FIG. 6 is a diagram of example functional components of a transform component of the TCE;

FIGS. 7-15 are diagrams of example user interfaces capable of being generated by the transform component of FIG. 6.

DETAILED DESCRIPTION

Figure 8A:
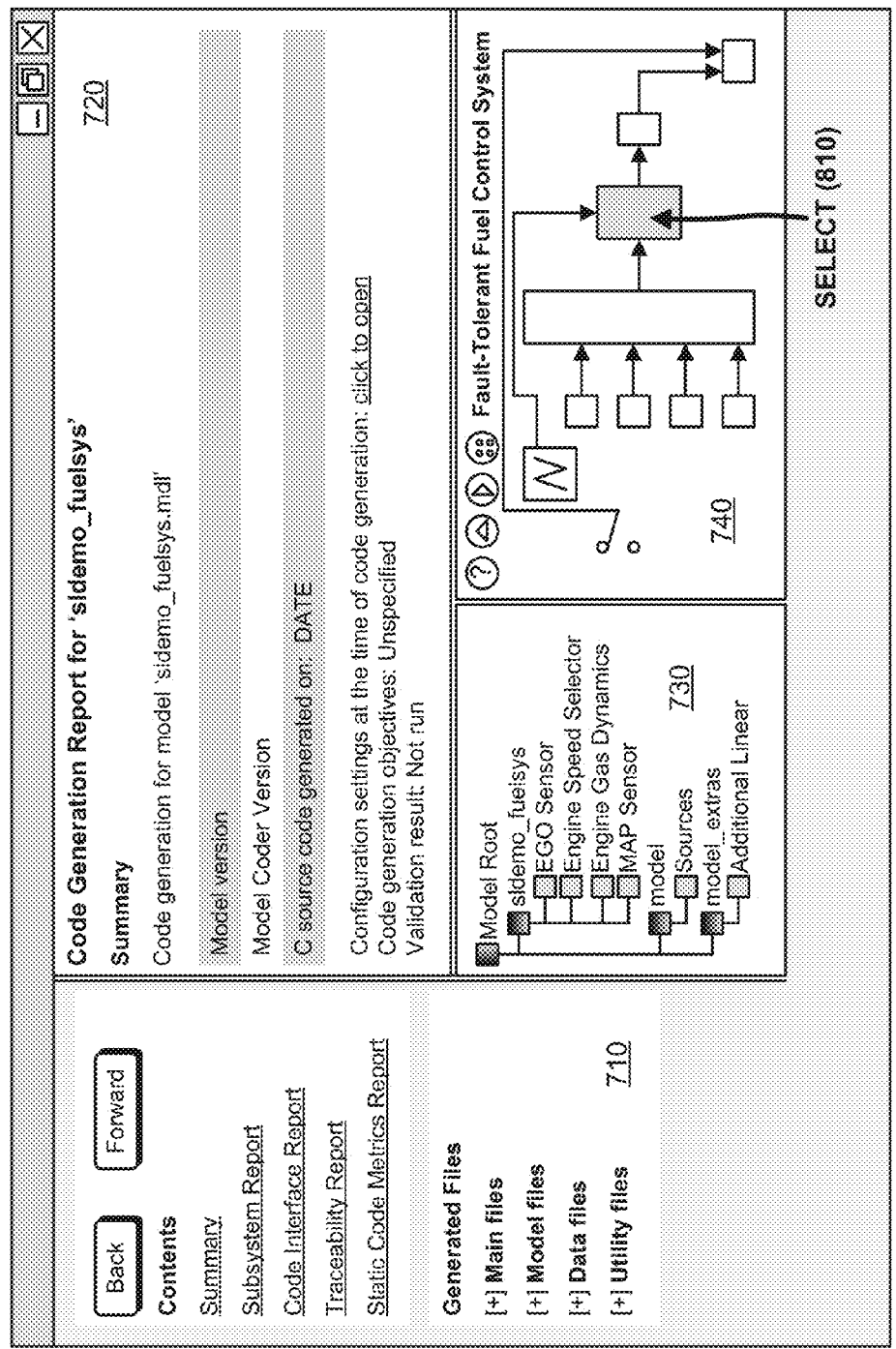

The following detailed description refers to the accompanying drawings. The same reference numbers in different drawings may identify the same or similar elements.

A technical computing environment (TCE) may provide a computing environment that allows users to perform tasks related to disciplines, such as, but not limited to, mathematics, science, engineering, medicine, business, etc., more efficiently than if the tasks were performed in another type of computing environment, such as an environment that requires the user to develop code in a conventional programming language, such as C++, C, Fortran, Pascal, etc. In one example, a TCE may include a dynamically-typed programming language (e.g., the M language, a MATLAB® language, a MATLAB-compatible language, a MATLAB-like language, etc.) that can be used to express problems and/or solutions in mathematical notations.

Code generated by the TCE may be tested to determine whether the code will function properly (e.g., when executed). In one example, the code may be validated by determining traceability between the generated code and a model generated by the TCE. The TCE may permit a user of the TCE to navigate between the generated code and the model in order to determine traceability. However, such navigation is permissible only within the TCE.

OVERVIEW

Systems and/or methods described herein may transform modeling environment code and/or a model into a non-modeling environment format file. In one example, the non-modeling environment format file may be viewed in any web browser and may include interrelationships between the code and the model. The non-modeling environment format file may enable a user to view the code, the model, and the interrelationships without the need of a modeling environment, such as a TCE.

FIG. 1 is a diagram of an overview of an example implementation described herein. As shown in FIG. 1, a computing environment, such as a technical computing environment (TCE), may include a transform component. The transform component may receive code and a model generated by the TCE, and may transform the code and the model into an output file in a non-TCE format.

As further shown in FIG. 1, the transform component may receive code generated by the TCE, a model generated by the TCE, and information associated with relationships between the TCE code and the TCE model. The TCE code may include text-based code that may require further processing to execute, binary code that may be executed, text files that may be executed in conjunction with other executables, a graphical model, one or more combinations of the aforementioned, etc. In one example, the TCE code may be in a format viewable by the TCE. The TCE model may include a textual model, a block diagram model with one or more model elements (e.g., blocks), one or more inputs, and one or more outputs, a combination of a textual model and a graphical model, etc. Each of the model elements may include a representation (e.g., a block) of a hardware device, a subsystem, another model, etc. of a system being modeled by the TCE. The relationships information may include information identifying: characters in the TCE code; blocks in the TCE model; actions associated between the TCE code and the TCE model (e.g., a selection of a block in the TCE model may cause corresponding lines of the TCE code to be highlighted and vice versa); etc.

As further shown in FIG. 1, the transform component may receive inputs from a user of the TCE. In one example, the inputs may include information identifying portions of the TCE code and/or the TCE model to include in or exclude from a transformed output file. The transform component may combine (e.g., based on the inputs) the TCE code, the TCE model, and the relationships information to generate an output file in a non-modeling environment format (e.g., a non-TCE format, a modeling environment different than the TCE, etc.). The transform component may output (e.g., display) and/or store the output file. In one example, the output file, when executed, may display a code panel (e.g., a window) for displaying the TCE code (e.g., in the non-TCE format) and a model panel for displaying the TCE model (e.g., in the non-TCE format). Alternatively, or additionally, the output file, when executed, may display a code navigation panel that enables a user to navigate the TCE code displayed in the code panel, and a model navigation panel that enables a user to navigate the TCE model displayed in the model panel.

The terms "code" and "program code," as used herein, are to be used interchangeably and are to be broadly interpreted to include text-based code that may not require further processing to execute (e.g., C++ code, Hardware Description Language (HDL) code, very-high-speed integrated circuits (VHSIC) HDL(VHDL) code, Verilog, Java, and/or other types of hardware or software based code that may be compiled and/or synthesized); binary code that may be executed (e.g., executable files that may directly be executed by an operating system, bitstream files that can be used to configure a field programmable gate array (FPGA), Java byte code, object files combined together with linker directives, source code, makefiles, etc.); text files that may be executed in conjunction with other executables (e.g., Python text files, a collection of dynamic-link library (DLL) files with text-based combining, configuration information that connects pre-compiled modules, an extensible markup language (XML) file describing module linkage, etc.); etc. In one example, code may include different combinations of the above-identified classes (e.g., text-based code, binary code, text files, etc.). Alternatively, or additionally, code may include code generated using a dynamically-typed programming language (e.g., the M language, a MATLAB® language, a MATLAB-compatible language, a MATLAB-like language, etc.) that can be used to express problems and/or solutions in mathematical notations. Alternatively, or additionally, code may be of any type, such as function, script, object, etc., and a portion of code may include one or more characters, lines, etc. of the code.

Example Environment Arrangement

FIG. 2 is a diagram of an example environment 200 in which systems and/or methods described herein may be implemented. As illustrated, environment 200 may include a client device 210 interconnected with a server device 220 via a network 230. Components of environment 200 may interconnect via wired and/or wireless connections. A single client device 210, server device 220, and network 230 have been illustrated in FIG. 2 for simplicity. In practice, environment 200 may include more client devices 210, server devices 220, and/or networks 230. In one example implementation, client device 210 and server device 220 may be provided in a single device or may be provided in separate devices.

Client device 210 may include one or more devices that are capable of communicating with server device 220 via network 230. For example, client device 210 may include a laptop computer, a personal computer, a tablet computer, a desktop computer, a workstation computer, a smart phone, a personal digital assistant (PDA), and/or other computation and communication devices.

Server device 220 may include one or more server devices, or other types of computation and communication devices, that gather, process, and/or provide information in a manner described herein. Server device 220 may include a device that is capable of communicating with client device 210 (e.g., via network 230). In one example, server device 220 may include one or more laptop computers, personal computers, workstation computers, servers, central processing units (CPUs), graphical processing units (GPUs), application-specific integrated circuits (ASICs), field-programmable gate arrays (FPGAs), etc. and/or software (e.g., a simulator) executing on the aforementioned devices. In one example, server device 220 may include TCE 240 and may perform some or all of the functionality described herein for client device 210. Alternatively, server device 220 may be omitted and client device 210 may perform all of the functionality described herein for client device 210.

Network 230 may include a network, such as a local area network (LAN), a wide area network (WAN), a metropolitan area network (MAN), a telephone network, such as the Public Switched Telephone Network (PSTN), an intranet, the Internet, or a combination of networks.

TCE 240 may be provided within a computer-readable medium of client device 210. Alternatively, or additionally, TCE 240 may be provided in another device (e.g., server device 220) that is accessible by client device 210. TCE 240 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In one implementation, TCE 240 may include a dynamically-typed programming language (e.g., the M language, a MATLAB® language, a MATLAB-compatible language, a MATLAB-like language, etc.) that can be used to express problems and/or solutions in mathematical notations. One or more portions of TCE 240 may be provided as software as service.

For example, TCE 240 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, TCE 240 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

TCE 240 may further provide mathematical functions and/or graphical tools (e.g., for creating plots, surfaces, images, volumetric representations, etc.). In one implementation, TCE 240 may provide these functions and/or tools using toolboxes (e.g., toolboxes for signal processing, image processing, data plotting, parallel processing, etc.). Alternatively, or additionally, TCE 240 may provide these functions as block sets or in another way, such as via a library, etc.

TCE 240 may be implemented as a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

TCE 240 may include a programming language (e.g., the MATLAB language) that may be used to express problems and/or solutions in mathematical notations. The programming language may be dynamically typed and/or array-based. In a dynamically typed array-based computing language, data may be contained in arrays and data types of the data may be determined (e.g., assigned) at program execution time.

For example, suppose a program, written in a dynamically typed array-based computing language, includes the following statements:

A='hello'
A=int32([1, 2])
A=[1.1, 2.2, 3.3].

Now suppose the program is executed, for example, in a TCE, such as TCE 240. During run-time, when the statement "A='hello'" is executed the data type of variable "A" may be a string data type. Later when the statement "A=int32([1, 2])" is executed the data type of variable "A" may be a 1-by-2 array containing elements whose data type are 32 bit integers. Later, when the statement "A=[1.1, 2.2, 3.3]" is executed, since the language is dynamically typed, the data type of variable "A" may be changed from the above 1-by-2 array to a 1-by-3 array containing elements whose data types are floating point. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

TCE 240 may provide mathematical routines and a high-level programming language suitable for non-professional programmers and may provide graphical tools that may be used for creating plots, surfaces, images, volumetric representations, or other representations. TCE 240 may provide these routines and/or tools using toolboxes (e.g., toolboxes for signal processing, image processing, data plotting, parallel processing, etc.). TCE 240 may also provide these routines in other ways, such as, for example, via a library, local or remote database (e.g., a database operating in a computing cloud), remote procedure calls (RPCs), and/or an application programming interface (API). TCE 240 may be configured to improve runtime performance when performing computing operations. For example, TCE 240 may include a just-in-time (JIT) compiler.

Although FIG. 2 shows example components of environment 200, in other implementations, environment 200 may include fewer components, different components, differently arranged components, and/or additional components than those depicted in FIG. 2. Alternatively, or additionally, one or more components of environment 200 may perform one or more other tasks described as being performed by one or more other components of environment 200.

Example Device Architecture

FIG. 3 is an example diagram of a device 300 that may correspond to one or more of the devices of environment 200. As illustrated, device 300 may include a bus 310, a processing unit 320, a main memory 330, a read-only memory (ROM) 340, a storage device 350, an input device 360, an output device 370, and/or a communication interface 380. Bus 310 may include a path that permits communication among the components of device 300.

Processing unit 320 may include one or more processors, microprocessors, or other types of processing units that may interpret and execute instructions. Main memory 330 may include one or more random access memories (RAMs) or other types of dynamic storage devices that may store information and/or instructions for execution by processing unit 320. ROM 340 may include one or more ROM devices or other types of static storage devices that may store static information and/or instructions for use by processing unit 320. Storage device 350 may include a magnetic and/or optical recording medium and its corresponding drive.

Input device 360 may include a mechanism that permits a user to input information to device 300, such as a keyboard, a camera, an accelerometer, a gyroscope, a mouse, a pen, a microphone, voice recognition and/or biometric mechanisms, a remote control, a touch screen, a neural interface, etc. Output device 370 may include a mechanism that outputs information to the user, including a display, a printer, a speaker, etc. Communication interface 380 may include any transceiver-like mechanism that enables device 300 to communicate with other devices, networks, and/or systems. For example, communication interface 380 may include mechanisms for communicating with another device or system via a network.

As described herein, device 300 may perform certain operations in response to processing unit 320 executing software instructions contained in a computer-readable medium, such as main memory 330. A computer-readable medium may be defined as a non-transitory memory device. A memory device may include space within a single physical memory device or spread across multiple physical memory devices. The software instructions may be read into main memory 330 from another computer-readable medium, such as storage device 350, or from another device via communication interface 380. The software instructions contained in main memory 330 may cause processing unit 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of device 300, in other implementations, device 300 may include fewer components, different components, differently arranged components, and/or additional components than depicted in FIG. 3. Alternatively, or additionally, one or more components of device 300 may perform one or more other tasks described as being performed by one or more other components of device 300.

Example Technical Computing Environment

FIG. 4 is a diagram of example functional components of TCE 240. In one implementation, the functions described in connection with FIG. 4 may be performed by one or more components of device 300 (FIG. 3) and/or by one or more devices 300. As shown in FIG. 4, TCE 240 may include a block diagram editor 410, graphical entities 420, blocks 430, and/or an execution engine 440.

Block diagram editor 410 may include hardware or a combination of hardware and software that may be used to graphically specify models of dynamic systems. In one implementation, block diagram editor 410 may permit a user to perform actions, such as construct, edit, display, annotate, save, execute, and/or print a graphical model (e.g., a block diagram that visually and/or pictorially represents a dynamic system). In another implementation, block diagram editor 410 may permit a user to create and/or store data relating to graphical entities 420.

A textual interface may be provided to permit interaction with block diagram editor 410. A user may write scripts that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Graphical entities 420 may include hardware or a combination of hardware and software that may provide entities (e.g., signal lines, buses, etc.) that represent how data may be communicated between functional and/or non-functional units and blocks 430 of a model. Blocks 430 may include fundamental mathematical elements of a block diagram model.

Execution engine 440 may include hardware or a combination of hardware and software that may process a graphical model to produce simulation results, may convert the graphical model into executable code, and/or may perform other analyses and/or related tasks. In one implementation, for a block diagram graphical model, execution engine 440 may translate the block diagram into executable entities (e.g., units of execution) following the layout of the block diagram. The executable entities may be compiled and/or executed on a device (e.g., client device 210) to implement the functionality specified by the model.

Graphical models may include entities with relationships between the entities, and the relationships and/or the entities may have attributes associated with them. The entities may include model elements such as blocks 430 and ports. The relationships may include model elements such as lines (e.g., connector lines) and references. The attributes may include model elements such as value information and meta information for the model element associated with the attributes. Graphical models may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks (e.g., blocks 430) connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks (e.g., blocks 430). A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks (e.g., blocks 430) may be causal and/or non-causal. For example, a model may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

A sample time may be associated with the elements of a graphical model. For example, a graphical model may include a block (e.g., block 430) with a continuous sample time such as a continuous-time integration block that may integrate an input value as time of execution progresses. This integration may be specified by a differential equation. During execution the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Alternatively, or additionally, a graphical model may include a block (e.g., block 430) with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may include a block (e.g., block 430) with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block (e.g., a function-call block) to be evaluated at this point in time and before advancing execution time.

Further, the values of attributes of a graphical model may be inferred from other elements of the graphical model or attributes of the graphical model. For example, the graphical model may include a block (e.g., block 430), such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks (e.g., blocks 430) where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search may proceed by evaluating the sample time attribute of the first unit delay block since it is directly connected to the second unit delay block.

The values of attributes of a graphical model may be set to characteristics settings, such as one or more inherited settings, one or more default settings, etc. For example, the data type of a variable that is associated with a block (e.g., block 430) may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

Although FIG. 4 shows example functional components of TCE 240, in other implementations, TCE 240 may include fewer functional components, different functional components, differently arranged functional components, and/or additional functional components than depicted in FIG. 4. Alternatively, or additionally, one or more functional components of TCE 240 may perform one or more other tasks described as being performed by one or more other functional components of TCE 240.

Example Technical Computing Environment Operations

FIG. 5 is a diagram of example operations capable of being performed by TCE 240. TCE 240 may include the features described above in connection with, for example, one or more of FIGS. 1-4. As illustrated in FIG. 5, TCE 240 may include a transform component 500. The functions described in connection with transform component 500 may be performed by one or more components of device 300 (FIG. 3) and/or by one or more devices 300.

As further shown in FIG. 5, transform component 500 may receive code 510 generated by TCE 240, a model 520 generated by TCE 240, and information 530 associated with relationships between TCE code 510 and TCE model 520. In one example, transform component 500 may receive TCE code 510, TCE model 520, and relationships information 530 when a user of TCE 240 selects a command to generate a transformed output file. TCE code 510 may include text-based code that may require further processing to execute, binary code that may be executed, text files that may be executed in conjunction with other executables, a graphical model, one or more combinations of the aforementioned, etc. In one example, TCE code 510 may be in a format that is viewable only within TCE 240, as indicated by reference number 540. TCE model 520 may include a textual model, a block diagram model with one or more model elements (e.g., blocks), one or more inputs, and one or more outputs, a combination of a textual model and a graphical model, etc. Each of the model elements may include a representation (e.g., a block) of a hardware device, a subsystem, another model, etc. of a system being modeled by TCE 240. In one example, TCE model 520 may be in a format that is viewable only within TCE 240, as indicated by reference number 540.

Relationships information 530 may include information identifying: one or more characters in TCE code 510; blocks in TCE model 520; relationships between TCE code 510 and TCE model 520 (e.g., a selection of a block in TCE model 520 may cause corresponding lines of TCE code 510 to be highlighted); mappings between TCE code 510 and TCE model 520 (e.g., a block in TCE model 520 may be mapped to particular portions of TCE code 510); etc. In one example, relationships information 530 may be in a format that is viewable only within TCE 240, as indicated by reference number 540.

As further shown in FIG. 5, transform component 500 may receive inputs 550 from a user of TCE 240 (e.g., via an input device). In one example implementation, inputs 550 may include information identifying portions of TCE code 510 and/or TCE model 520 to include in or exclude from a transformed output file. For example, if the transformed output file is to be provided to a potential buyer or reviewer and the user of TCE 240 does not wish to reveal trade secrets in TCE code 510 and/or TCE model 520, inputs 550 may be used to limit information provided to the buyer/reviewer. In such a situation, inputs 550 may be used to provide enough information in the transformed output file so that the buyer/reviewer knows generally how TCE code 510 and/or TCE model 520 operate and what outputs are generated by TCE code 510 and/or TCE model 520. However, inputs 550 may prevent the buyer/reviewer from copying TCE code 510 and/or TCE model 520, and from reproducing the outputs generated by TCE code 510 and/or TCE model 520.

Transform component 500 may combine (e.g., based on inputs 550) TCE code 510, TCE model 520, and relationships information 530 to generate an output file 560 in a non-modeling environment format (e.g., a non-TCE format 570, such as a web format, a hypertext markup language (HTML) format, a Portable Document Format (PDF), etc.). Transform component 500 may output (e.g., display) and/or store output file 560. In one example, output file 560, when executed, may display a code panel for displaying TCE code 510 (e.g., in non-TCE format 570), and/or a model panel for displaying TCE model 520 (e.g., in non-TCE format 570). Alternatively, or additionally, output file 560, when executed, may display a code navigation panel that enables a user to navigate TCE code 510 displayed in the code panel, and/or a model navigation panel that enables a user to navigate TCE model 520 displayed in the model panel.

Alternatively, or additionally, output file 560, when executed, may display an integrated report that includes TCE code 510 in non-TCE format 570 and TCE model 520 in non-TCE format 570. For example, the integrated report may be in a format (e.g., a web format, a HTML format, a PDF, etc.) that is viewable in a web browser, and may be self-contained (e.g., suitable for a program that combines files together into a single zip file) archive of TCE code 510 and TCE model 520. The integrated report may be opened and reviewed without the need for a modeling environment (e.g., TCE 240), and may enable the reviewer to trace TCE code 510 to TCE model 520 from the code panel.

Alternatively, or additionally, display of output file 560 may enable a reviewer of output file 560 to see the relationships (e.g., as set forth in relationships information 530) between TCE code 510 and TCE model 520. A portion of TCE code 510 may include relationships with one or more portions (e.g., blocks) of TCE model 520, and a portion of TCE model 520 may include relationships with one or more portions of TCE code 510. The reviewer may interact with output file 560 to see the relationships and may utilize the relationships to determine traceability between TCE code 510 and TCE model 520 without being in a modeling environment (e.g., TCE 240). In one example, if a relationship does not exist between a portion of TCE code 510 and TCE model 520, or between a portion of TCE model 520 and TCE code 510, output file 560 may display an explanation as to why the relationship does not exist (e.g., may display an error message indicating an untraceable line, block, etc.).

Alternatively, or additionally, the reviewer may add comments and/or notations to the displayed output file 560. The comments and/or notations may be imported into TCE 240, and may be utilized to edit or review TCE code 510 and/or TCE model 520 within TCE 240. The reviewer may zoom in or out of any portion of the displayed output file 560, such as zooming in on a portion of the model presented in the model panel. If the user zooms in on a portion of the model presented in the model panel, output file 560 may modify the information displayed for the model based on the zooming operation.

Alternatively, or additionally, output file 560 may enable TCE code 510 and/or TCE model 520 to be reviewed without utilizing a modeling environment (e.g., TCE 240) that may require a license and consume an inordinate amount of computing resources. Output file 560 may be provided in a neutral media environment format (e.g., a web, HTML, PDF, etc. format) so that output file 560 may be easily imported into an environment that does not support the modeling environment.

Alternatively, or additionally, output file 560 may enable TCE code 510 and/or TCE model 520 to be archived for the future. For example, if TCE code 510 and/or TCE model 520 relate to a product that has a lifetime of fifty (50) years and there is an issue toward the end of the product's life, output file 560 may be utilized to investigate the issue. The modeling environment used to create TCE code 510 and/or TCE model 520 may not exist, and thus, TCE code 510 and/or TCE model 520 may not be recovered. However, the neutral media environment format of output file 560 may enable TCE code 510 and/or TCE model 520 to be analyzed, even far into the future.

Alternatively, or additionally, output file 560, when executed, may provide enough information so that a buyer/reviewer of TCE code 510 and/or TCE model 520 knows generally how TCE code 510 and/or TCE model 520 operate and what outputs are generated by TCE code 510 and/or TCE model 520. However, output file 560 may prevent the buyer/reviewer from copying TCE code 510 and/or TCE model 520, and from reproducing the outputs generated by TCE code 510 and/or TCE model 520. For example, output file 560 may display portions of TCE code 510 (e.g., an algorithm) but may not display data used in the portions of TCE code 510 (e.g., a parameter or a data set needed to execute the algorithm). In another example, output file 560 may display one or more links to portions of TCE 510 code that may be securely executed so that the buyer/reviewer may not be able to see all of TCE code 510 but may still have access to the functionality.

Alternatively, or additionally, output file 560 may, when executed, may display information associated with multiple TCE codes 510 and multiple TCE models 520. For example, a user may generate a first TCE code 510 and a first TCE model 520, and then may change the first TCE code 510 or the first TCE model 520 to generate a second TCE code 510 and a second TCE model 520. The second TCE code 510/TCE model 520 may be a different version of the first TCE code 510/TCE model 520. In such a situation, output file 560 may display first information associated with the first TCE code 510/TCE model 520 and second information associated with the second TCE code 510/TCE model 520. The user may compare the first information and the second information to determine the effect of the change to the first TCE code 510/TCE model 520. This may enable the user to compare different versions of TCE code 510 and/or TCE model 520 in an efficient manner. For example, the comparison may enable the user to determine what is new, what is deleted, what is changed, etc. in a color coded fashion.

In one example implementation, transform component 500 of TCE 240 may receive a model generated via TCE 240 (e.g., TCE model 520). Transform component 500 may semantically process TCE model 520 to generate derived information, and one or more relationships (e.g., relationships information 530) between TCE model 520 and the derived information. In one example, when processing TCE model 520, transform component 500 may compile TCE model 520 to infer data types in TCE model 520, order execution of two or more elements of TCE model 520, infer dimensions in TCE model 520, etc. Alternatively, or additionally, when processing TCE model 520, transform component 500 may optimize TCE model 520 via loop unrolling, inlining, outlining, expression unfolding, etc. The derived information may include TCE code 510, simulation results, coverage results, verification results, etc.

Transform component 500 may store, via TCE 240, the relationship(s) in a format (e.g., output file 560) that enables a general purpose environment to read the relationship(s) and to navigate between TCE model 520 and the derived information using the relationship(s). In one example, the general purpose environment may include a web browser. The format may enable the general purpose environment to read the relationship(s) and to navigate between the model and the derived information using the relationship(s), without semantic processing of TCE model 520.

Although FIG. 5 shows example operations capable of being performed by TCE 240, in other implementations, TCE 240 may perform fewer operations, different operations, and/or additional operations than depicted in FIG. 5. Alternatively, or additionally, one or more components of FIG. 5 may perform one or more other tasks described as being performed by one or more other components of FIG. 5.

Example Transform Component Operations

FIG. 6 is a diagram of example functional components of transform component 500 (FIG. 5). The functions described in connection with transform component 500 may be performed by one or more components of device 300 (FIG. 3) and/or by one or more devices 300. As shown in FIG. 6, transform component 500 may include a media file creator component 600 an interactive graphic file creator component 610, a script file creator component 620, and a combiner component 630.

Media file creator component 600 may receive TCE code 510, and may convert one or more portions of TCE code 510 into a media file 640. Media file 640 may include a file in a media format, such as, for example, a PDF, a word processing format, an HTML format, etc. In one example, media file creator component 600 may tag one or more portions of TCE code 510, and may translate the tagged portions into media file 640. As further shown in FIG. 6, media file creator component 600 may provide media file 640 to combiner component 630.

Interactive graphic file creator component 610 may receive TCE model 520, and may convert one or more portions of TCE model 520 into an interactive graphic file 650. Interactive graphic file 650 may include a file in an interactive graphic format, such as, for example, a scalable vector graphics (SVG) format, an interactive PDF, etc. In one example, interactive graphic file 650 may include an image capturing format that enables a user to zoom in and out of the captured images of TCE model 520, without a loss of quality. Alternatively, or additionally, interactive graphic file creator component 610 may receive a textual-based, a graphical-based, or a textual and graphical-based TCE model 520. As further shown in FIG. 6, interactive graphic file creator component 610 may provide interactive graphic file 650 to combiner component 630.

Script file creator component 620 may receive relationships information 530, and may convert relationships information 530 into a script file 660. Script file 660 may include a file in a script format, such as, for example, a JavaScript format, a Windows script format, a Unix script format, Extensible Markup Language (XML) format, etc. In one example, script file 660 may include a data set that provides relationships between portions of TCE code 510, a data set that provides relationships between blocks of TCE model 520, a mapping file that maps the data set for TCE code 510 with the data set for TCE model 520, etc. Script file 660 may enable the information displayed by output file 560 to react to any gestures or actions (e.g., selection, a mouse click, a sliding gesture, etc.) that may be performed on the information by a user of output file 560.

For example, the user may select (e.g., with a mouse) a block of TCE model 520 displayed by output file 560, and script file 660 may identify and display information associated with the selected block. Script file 660 may also identify (e.g., highlight) lines of TCE code 510, displayed by output file 560, associated with the selected block. Alternatively, or additionally, TCE code 510 and TCE model 520 may be hierarchical (e.g., TCE model 520 may include sub-blocks and TCE code 510 may include doe modules). As the user navigates to a particular hierarchy of TCE model 520, script file 660 may adjust the display of TCE code 510 to show a portion of TCE code 510 related to the particular hierarchy of TCE model 520. Alternatively, or additionally, a block of TCE model 520 may include behavior associated with the block, data associated with the block, a parameter associated with the block, analysis information (e.g., coverage results) associated with the block, etc. When the user selects the block, interactive graphic file 650 may display default information associated with the block, and may enable the user to change the information displayed for the block. If the user hovers over the block for a particular time period, additional information associated with the block may be displayed. Further examples of such gestures are provided below in connection with, for example, one or more of FIGS. 7-15. As further shown in FIG. 6, script file creator component 620 may provide script file 660 to combiner component 630.

Combiner component 630 may receive media file 640, interactive graphic file 650, script file 660, and inputs 550. Combiner component 630 may combine (e.g., based on inputs 550) media file 640, interactive graphic file 650, and script file 660 to generate output file 560 in a non-modeling environment format (e.g., non-TCE format 570). In one example, combiner component 630 may utilize inputs 550 to determine portions of media file 640, interactive graphic file 650, and script file 660 to include in or exclude from output file 560. Combiner component 630 may output (e.g., display) and/or store output file 560. In one example implementation, combiner component 630 may automatically test media file 640, interactive graphic file 650, script file 660, and/or output file 560 to determine whether traceability exists between media file 640 and interactive graphic file 650. Alternatively, or additionally, a user may manually test output file 560 to determine whether traceability exists between media file 640 and interactive graphic file 650 (e.g., by selecting links, blocks, etc. and verifying that traceability is correct).

Although FIG. 6 shows example functional components of transform component 500, in other implementations, transform component 500 may include fewer functional components, different functional components, differently arranged functional components, and/or additional functional components than depicted in FIG. 6. Alternatively, or additionally, one or more functional components of transform component 500 may perform one or more other tasks described as being performed by one or more other functional components of transform component 500.

Example Output File User Interfaces

FIGS. 7-15 are diagrams of example user interfaces 700-1500 capable of being generated by transform component 500 (FIGS. 5 and 6). In one example, user interfaces 700-1500 may correspond to information provided by output file 560 (FIGS. 5 and 6). User interfaces 700-1500 may include graphical user interfaces (GUIs) or non-graphical user interfaces, such as text-based interfaces. User interfaces 700-1500 may provide information to users via customized interfaces (e.g., proprietary interfaces) and/or other types of interfaces (e.g., browser-based interfaces, etc.). User interfaces 700-1500 may receive user inputs via one or more input devices, may be user-configurable (e.g., a user may change the sizes of user interfaces 700-1500, information displayed in user interfaces 700-1500, color schemes used by user interfaces 700-1500, positions of text, images, icons, windows, etc., in user interfaces 700-1500, etc.), and/or may not be fully or partially user-configurable. Information associated with user interfaces 700-1500 may be selected and/or manipulated by a user of client device 210 and/or server device 220 (e.g., via a touch screen display, a mouse, a keyboard, a keypad, voice commands, etc.).

As shown in FIG. 7, user interface 700 may include a variety of information associated with output file 560. For example, user interface 700 may include a code navigation panel 710, a code panel 720, a model navigation panel 730, and a model panel 740.

Code navigation panel 710 may enable a user to navigate a representation (e.g., media file 640) of TCE code 510 provided in code panel 720. For example, code navigation panel 710 may include links to reports (e.g., subsystem report, traceability report, etc.) that may be displayed in code panel 720, and a list of generated files (e.g., main files, model files, data files, utility files, etc.) that may be displayed in code panel 720. As further shown in FIG. 7, code navigation panel 710 may include code navigation buttons 750 that control backward and forward navigation through information displayed in code panel 720.

Code panel 720 may include a representation (e.g., media file 640) of TCE code 510. In one example, code panel 720 may display information associated with a report that is selected in code navigation panel 710 (e.g., a "Code Generation Report" for a fuel system). Alternatively, or additionally, code panel 720 may display information associated with a generated file that is selected in code navigation panel 710. Alternatively, or additionally, code panel 720 may display TCE code 510 information associated with a portion of TCE model 520 selected in model navigation panel 730 and/or model panel 740.

Model navigation panel 730 may enable a user to navigate a representation (e.g., interactive graphic file 650) of TCE model 520 provided in model panel 740. For example, model navigation panel 730 may include a directory of elements (e.g., blocks) provided in the representation of TCE model 520 displayed in model panel 740.

Model panel 740 may include a representation (e.g., interactive graphic file 650) of TCE model 520. In one example, model panel 740 may display information associated with an element that is selected from the directory of model navigation panel 730 (e.g., a "Fault-Tolerant Fuel Control System"). Alternatively, or additionally, model panel 740 may display TCE model 520 information associated with a portion of TCE code 510 selected in code navigation panel 710 and/or code panel 720. As further shown in FIG. 7, model panel 740 may include model navigation buttons 760 that control navigation through information displayed in model panel 740.

Although user interface 700 depicts a variety of information, in other implementations, user interface 700 may depict less information, different information, differently arranged information, and/or additional information than depicted in FIG. 7.

As shown in FIGS. 8A and 8B, user interface 800 may include a variety of information associated with output file 560. For example, user interface 800 may include code navigation panel 710, code panel 720, model navigation panel 730, and model panel 740. Code navigation panel 710, code panel 720, model navigation panel 730, and model panel 740 may include the features described above in connection with, for example, FIG. 7.

As further shown in FIG. 8A, a user of user interface 800 may select any block in TCE model 520 displayed in model panel 740. In one example, the user may select a subsystem block of TCE model 520, as indicated by reference number 810. Upon selection of the subsystem block, script file 660 may determine portion(s) of TCE code 510 that are related to the subsystem block. As shown in FIG. 8B, script file 660 may indicate (e.g., highlight) and display the determined portion(s) of TCE code 510, as indicated by reference number 820. Script file 660 may also include an explanation of the relationship between the determined portion(s) of TCE code 510 and the subsystem block. In one example, if multiple portions of TCE code 510 are indicated (e.g., highlighted) and cannot be displayed in code panel 720 at the same time, user interface 800 may include a mechanism (e.g., a button, a link, etc.) to navigate (e.g., scroll) through the highlighted portions of TCE code 510. In one implementation, script file 660 may utilize different colors for highlighting (e.g., as selected by a user) or different mechanisms to distinguish displayed information (e.g., different fonts, different colors, etc.).

As further shown in FIG. 8B, script file 660 may update model panel 740 to display a portion of TCE model 520 that relates to the subsystem block (e.g., a "Fuel Rate Control Subsystem"), rather than the "Fault-Tolerant Fuel Control System." Script file 660 may update code navigation panel 710 to highlight and display a model file (e.g., "sldemo_fuelsys.c"), as indicated by reference number 830. Script file 660 may update model navigation panel 730 to highlight and display the subsystem name (e.g., "fuel_rate_control") in the model hierarchical tree, as indicated by reference number 840. Such an arrangement may provide traceability from TCE model 520 to TCE code 510.

Although user interface 800 depicts a variety of information, in other implementations, user interface 800 may depict less information, different information, differently arranged information, and/or additional information than depicted in FIGS. 8A and 8B.

Figure 9:
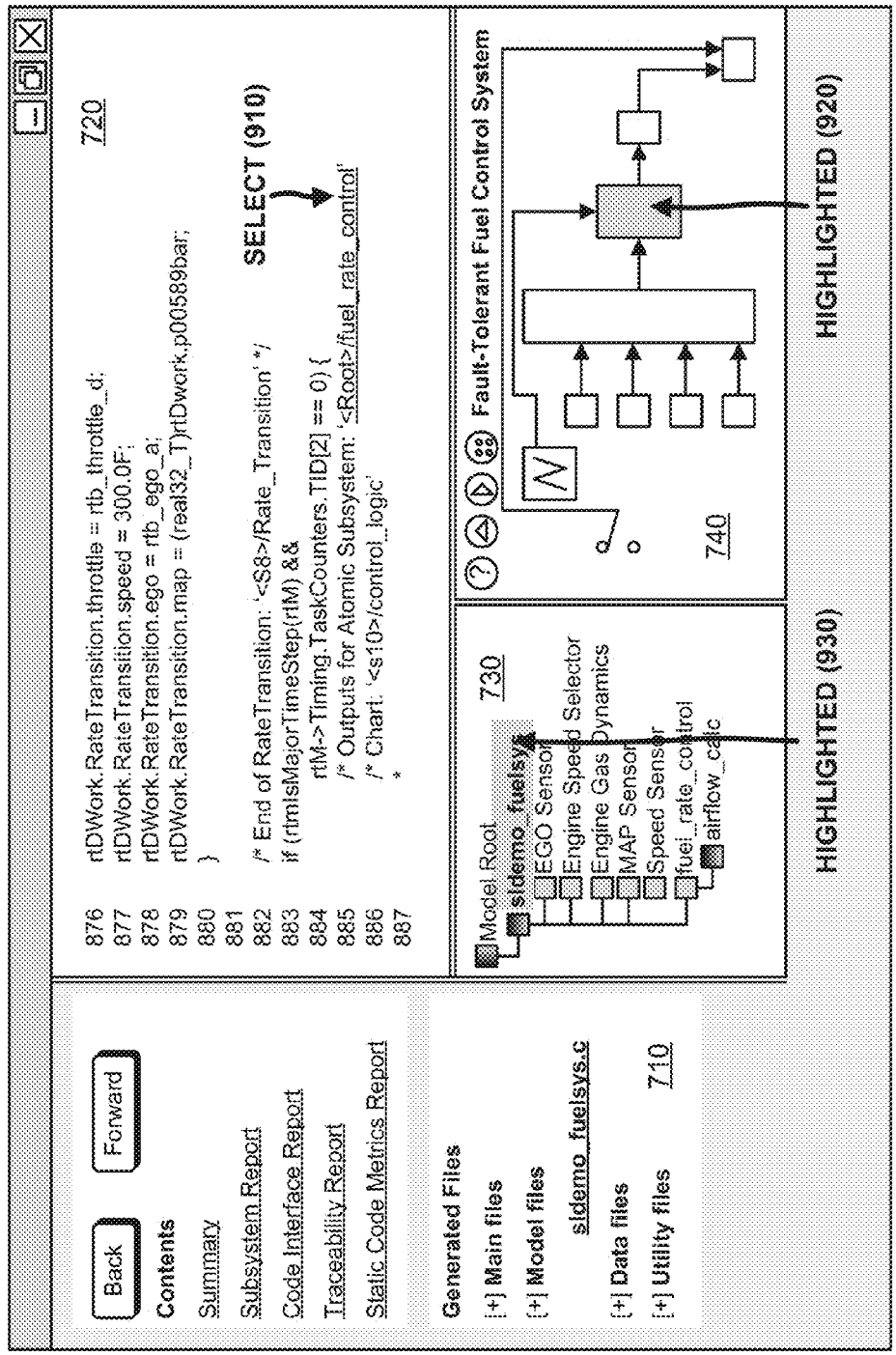

As shown in FIG. 9, user interface 900 may include a variety of information associated with output file 560. For example, user interface 900 may include code navigation panel 710, code panel 720, model navigation panel 730, and model panel 740. Code navigation panel 710, code panel 720, model navigation panel 730, and model panel 740 may include the features described above in connection with, for example, one or more of FIGS. 7 and 8.

As further shown in FIG. 9, a user of user interface 900 may select any line of TCE code 510 displayed in code panel 720. In one example, the user may select a fuel rate control link (e.g., a hyperlink) of TCE code 510, as indicated by reference number 910. Upon selection of the fuel rate control hyperlink of TCE code 510, script file 660 may determine block(s) of TCE model 520 that are related to the selected hyperlink. Script file 660 may indicate (e.g., highlight) and display the determined block(s) of TCE model 520, as indicated by reference number 920. Script file 660 may also provide an explanation of the relationship between the selected hyperlink of TCE code 510 and the determined block(s) of TCE model 520. In one example, if multiple blocks of TCE model 520 are highlighted and cannot be displayed in model panel 740 at the same time, user interface 900 may include a mechanism (e.g., a button, a link, etc.) to scroll through the highlighted blocks of TCE model 520.

As further shown in FIG. 9, script file 660 may update model navigation panel 730 to highlight a name (e.g., "sldemo_fuelsys"), in the model hierarchical tree, that is a parent of the highlighted block of TCE model 520, as indicated by reference number 930. Such an arrangement may provide traceability from TCE code 510 to TCE model 520.

Although user interface 900 depicts a variety of information, in other implementations, user interface 900 may depict less information, different information, differently arranged information, and/or additional information than depicted in FIG. 9.

Figure 10:
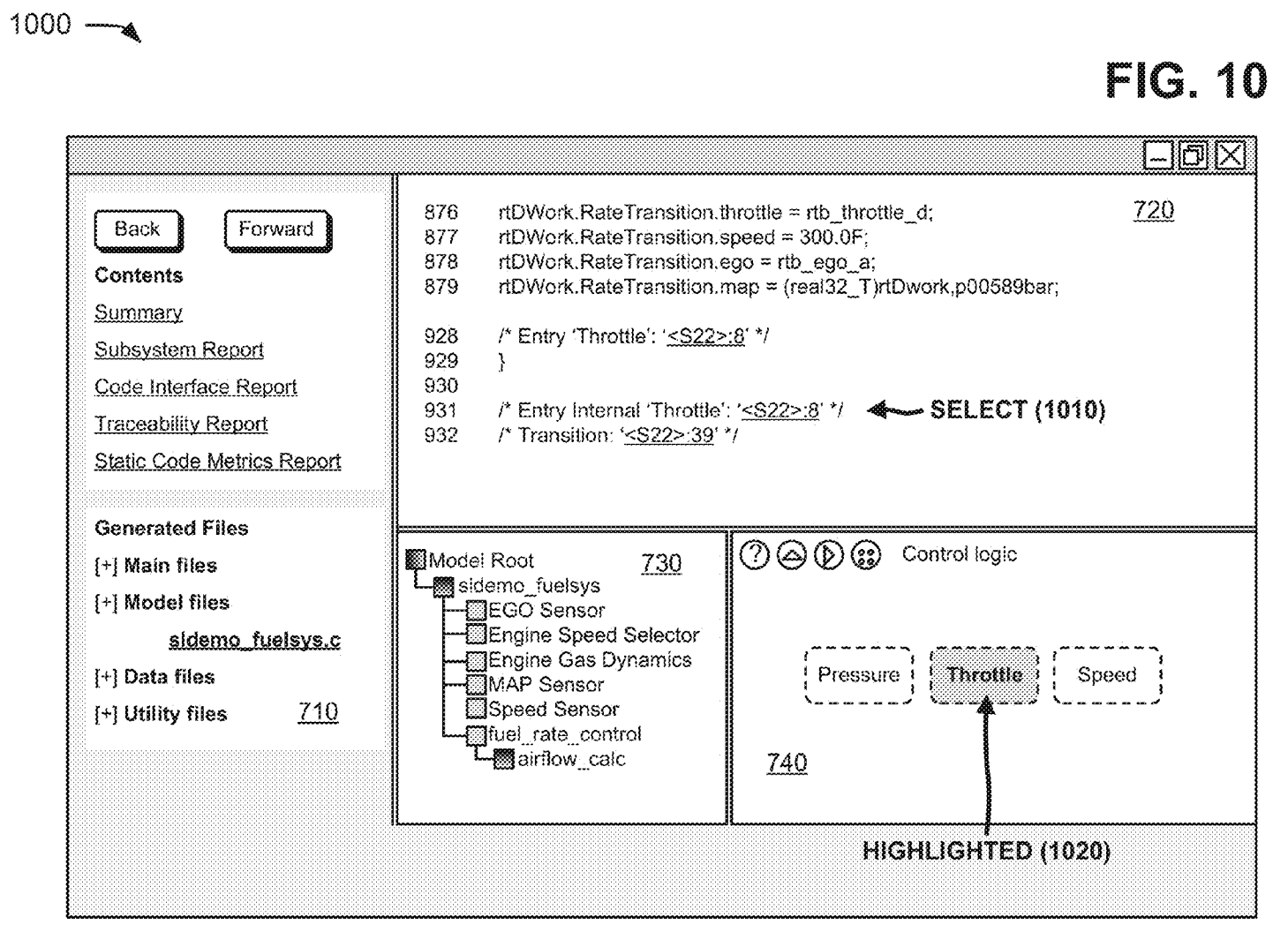

As shown in FIG. 10, user interface 1000 may include a variety of information associated with output file 560. For example, user interface 1000 may include code navigation panel 710, code panel 720, model navigation panel 730, and model panel 740. Code navigation panel 710, code panel 720, model navigation panel 730, and model panel 740 may include the features described above in connection with, for example, one or more of FIGS. 7-9.

As further shown in FIG. 10, a user of user interface 1000 may select any line of TCE code 510 displayed in code panel 720. In one example, the user may select a state chart link (e.g., a hyperlink) of TCE code 510, as indicated by reference number 1010. Upon selection of the state chart hyperlink of TCE code 510, script file 660 may determine state chart block(s) of TCE model 520 that are related to the selected hyperlink. Script file 660 may indicate (e.g., highlight) and display the determined state chart block(s) of TCE model 520, as indicated by reference number 1020. Script file 660 may also provide an explanation of the relationship between the selected hyperlink of TCE code 510 and the determined state chart block(s) of TCE model 520. In one example, if multiple state chart blocks of TCE model 520 are highlighted and cannot be displayed in model panel 740 at the same time, user interface 1000 may include a mechanism (e.g., a button, a link, etc.) to scroll through the highlighted blocks of TCE model 520.

Although user interface 1000 depicts a variety of information, in other implementations, user interface 1000 may depict less information, different information, differently arranged information, and/or additional information than depicted in FIG. 10.

Figure 11:
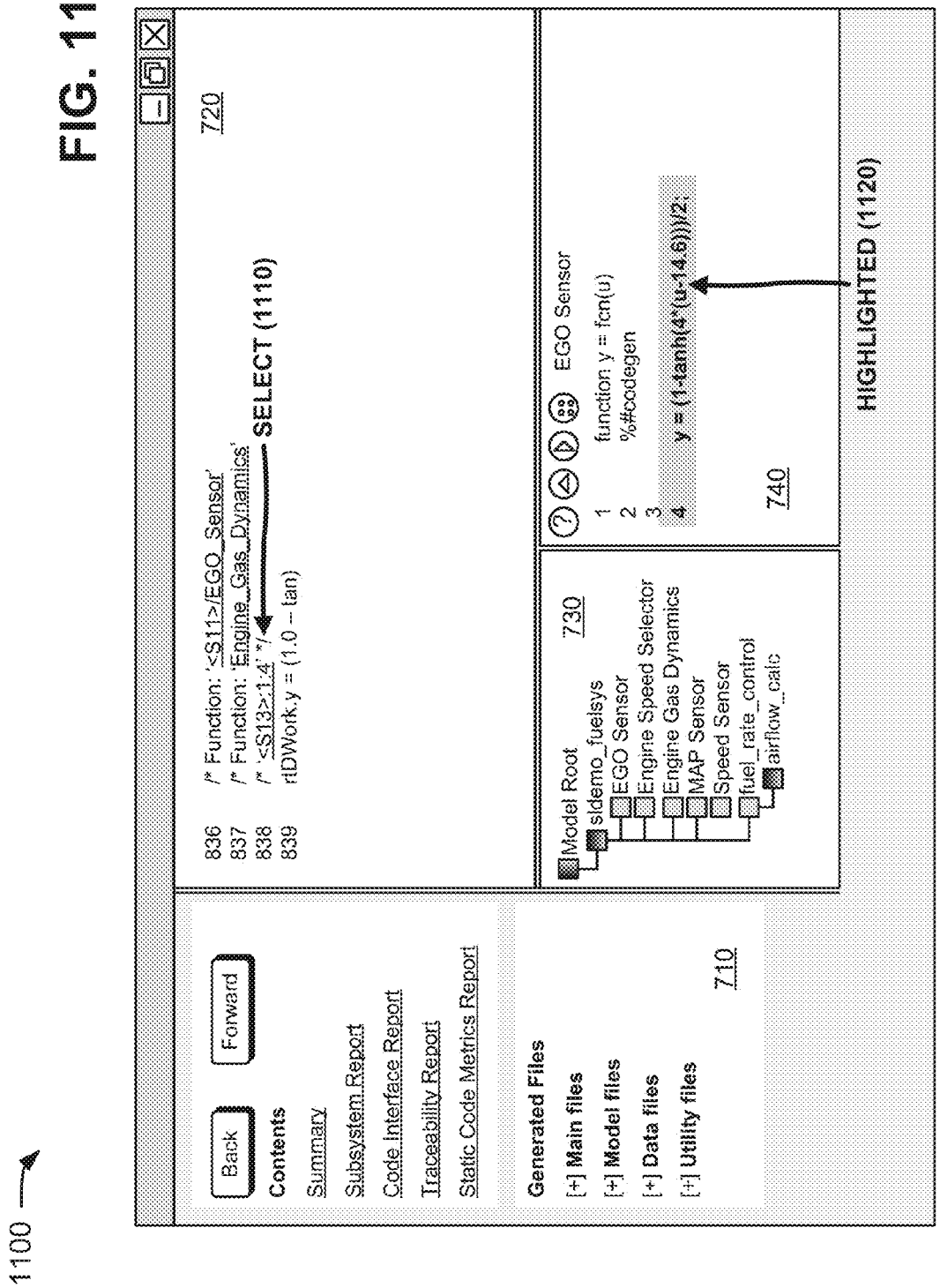

As shown in FIG. 11, user interface 1100 may include a variety of information associated with output file 560. For example, user interface 1100 may include code navigation panel 710, code panel 720, model navigation panel 730, and model panel 740. Code navigation panel 710, code panel 720, model navigation panel 730, and model panel 740 may include the features described above in connection with, for example, one or more of FIGS. 7-10.

As further shown in FIG. 11, a user of user interface 1100 may select any line of TCE code 510 displayed in code panel 720. In one example, the user may select a block link (e.g., a hyperlink) of TCE code 510, as indicated by reference number 1110. Upon selection of the function block hyperlink of TCE code 510, script file 660 may determine function block(s) of TCE model 520 that are related to the selected hyperlink. Script file 660 may indicate (e.g., highlight) and display the determined function block(s) of TCE model 520, as indicated by reference number 1120. Script file 660 may also provide an explanation of the relationship between the selected hyperlink of TCE code 510 and the determined function block(s) of TCE model 520. In one example, if multiple function blocks of TCE model 520 are highlighted and cannot be displayed in model panel 740 at the same time, user interface 1100 may include a mechanism (e.g., a button, a link, etc.) to scroll through the highlighted blocks of TCE model 520.

Although user interface 1100 depicts a variety of information, in other implementations, user interface 1100 may depict less information, different information, differently arranged information, and/or additional information than depicted in FIG. 11.

Figure 12:
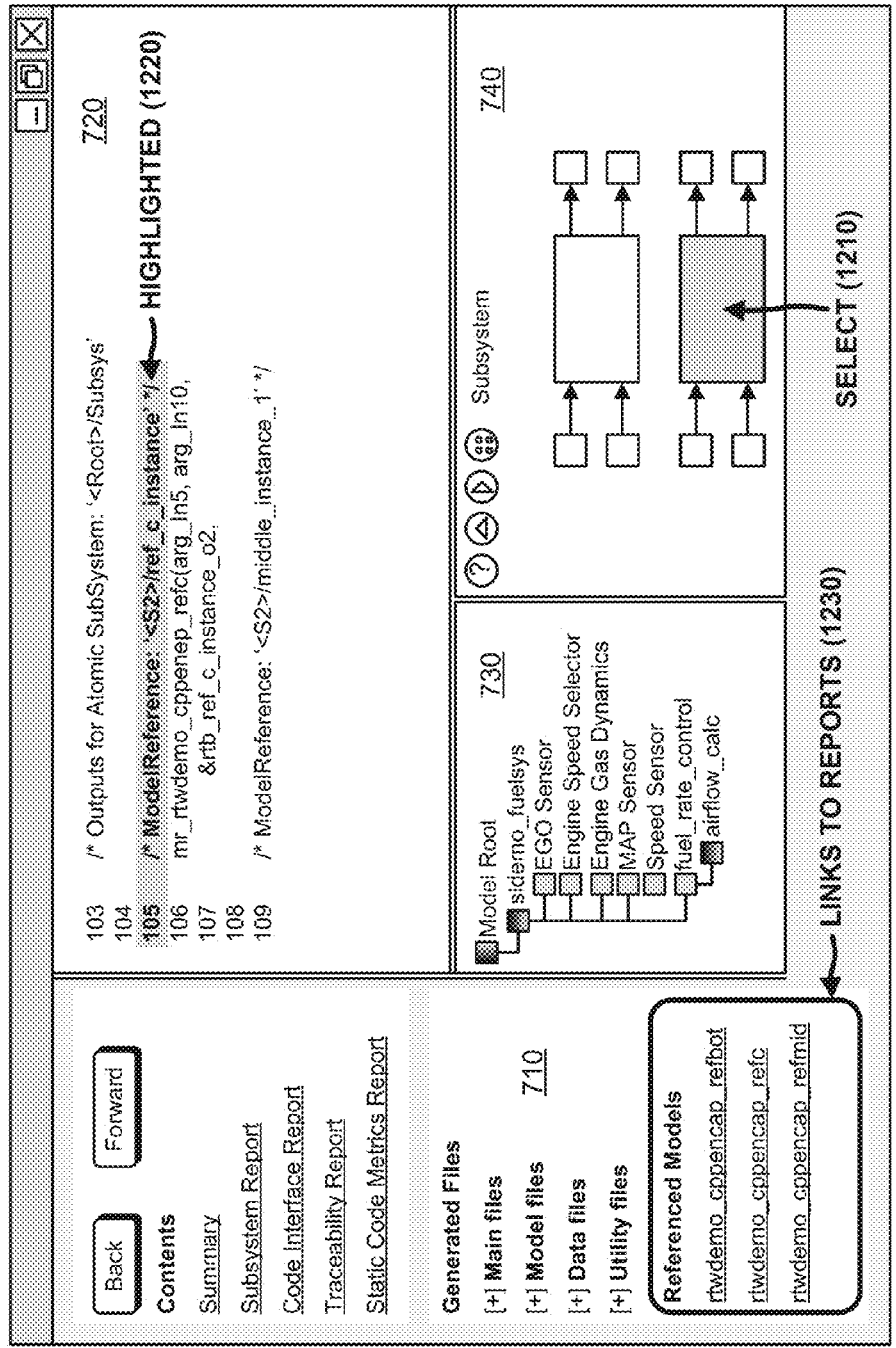

As shown in FIG. 12, user interface 1200 may include a variety of information associated with output file 560. For example, user interface 1200 may include code navigation panel 710, code panel 720, model navigation panel 730, and model panel 740. Code navigation panel 710, code panel 720, model navigation panel 730, and model panel 740 may include the features described above in connection with, for example, one or more of FIGS. 7-11.

As further shown in FIG. 12, a user of user interface 1200 may select a block of TCE model 520 displayed in model panel 740. In one example, the user may select a particular block of TCE model 520, as indicated by reference number 1210. Upon selection of the particular block of TCE model 520, script file 660 may determine portion(s) of TCE code 510 that are related to the selected block. Script file 660 may highlight and display the determined portion(s) of TCE code 510, as indicated by reference number 1220. In one example, if multiple portions of TCE code 510 are highlighted and cannot be displayed in code panel 720 at the same time, user interface 1200 may include a mechanism (e.g., a button, a link, etc.) to scroll through the highlighted portions of TCE code 510.

As further shown in FIG. 12, script file 660 may update code navigation panel 710 to include links to referenced model reports, as indicated by reference number 1230. The referenced model reports may be associated with the particular block selected in TCE model 720. In order to see a model associated with one of the referenced model reports, the user may select one of the links (e.g., "rtwdemo_cppencap_refbot") of the referenced model reports. When the user selects one of the links, the referenced model report associated with the selected link may be displayed to the user.

Although user interface 1200 depicts a variety of information, in other implementations, user interface 1200 may depict less information, different information, differently arranged information, and/or additional information than depicted in FIG. 12.

Figure 13:
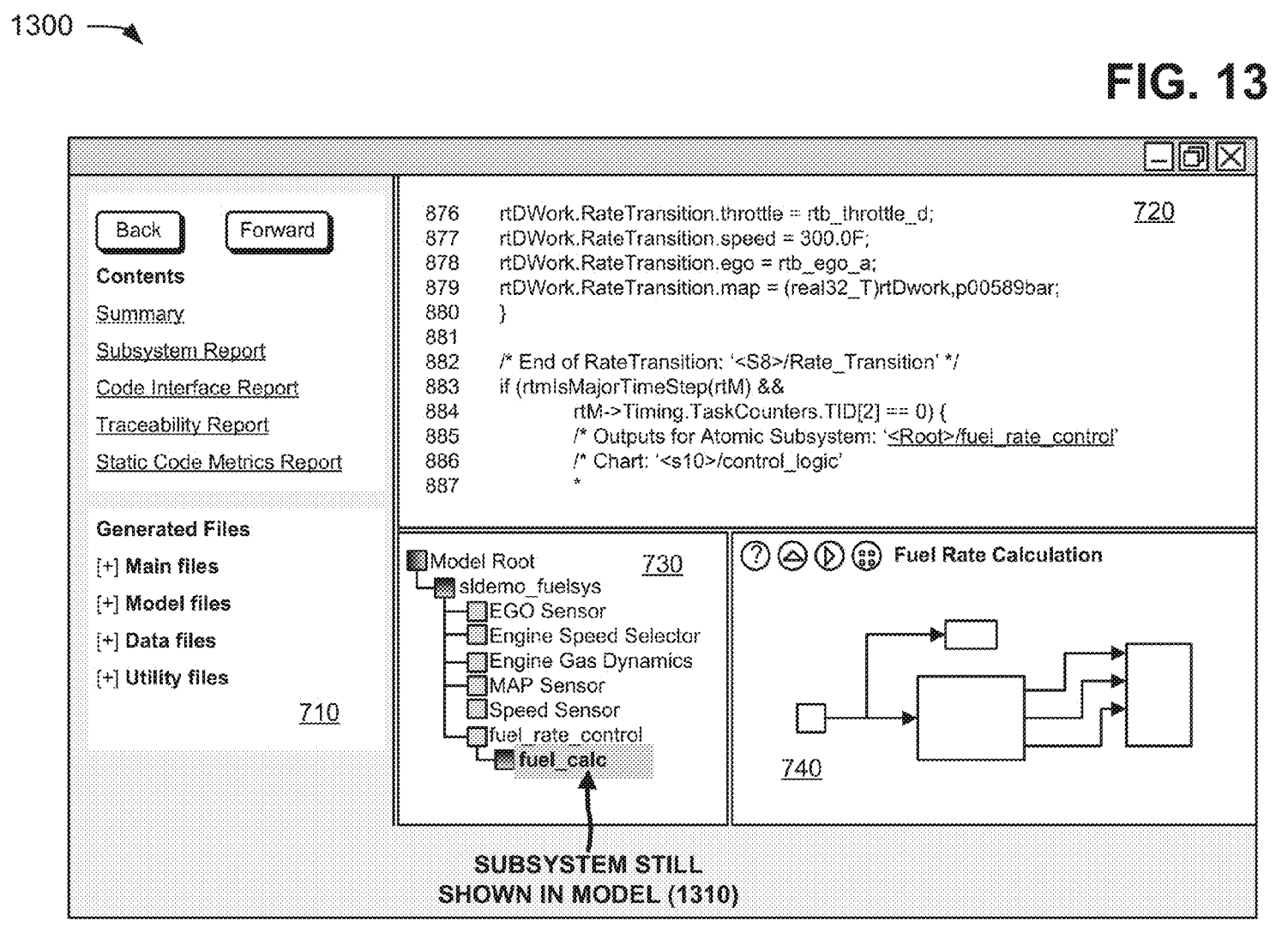

As shown in FIG. 13, user interface 1300 may include a variety of information associated with output file 560. For example, user interface 1300 may include code navigation panel 710, code panel 720, model navigation panel 730, and model panel 740. Code navigation panel 710, code panel 720, model navigation panel 730, and model panel 740 may include the features described above in connection with, for example, one or more of FIGS. 7-12.

Generated TCE code 510 for a subsystem of TCE model 520 may be similar to generated TCE code 510 for the entire TCE model 520. The generated TCE code 510 for the subsystem may only be traceable to the subsystem and blocks provided below the subsystem. As further shown in FIG. 13, model panel 740 may display the subsystem (e.g., a "Fuel Rate Calculation" subsystem), and model navigation panel 730 may display a name of the subsystem (e.g., "fuel_calc") in the directory tree, as indicated by reference number 1310.

Although user interface 1300 depicts a variety of information, in other implementations, user interface 1300 may depict less information, different information, differently arranged information, and/or additional information than depicted in FIG. 13.

Figure 14:
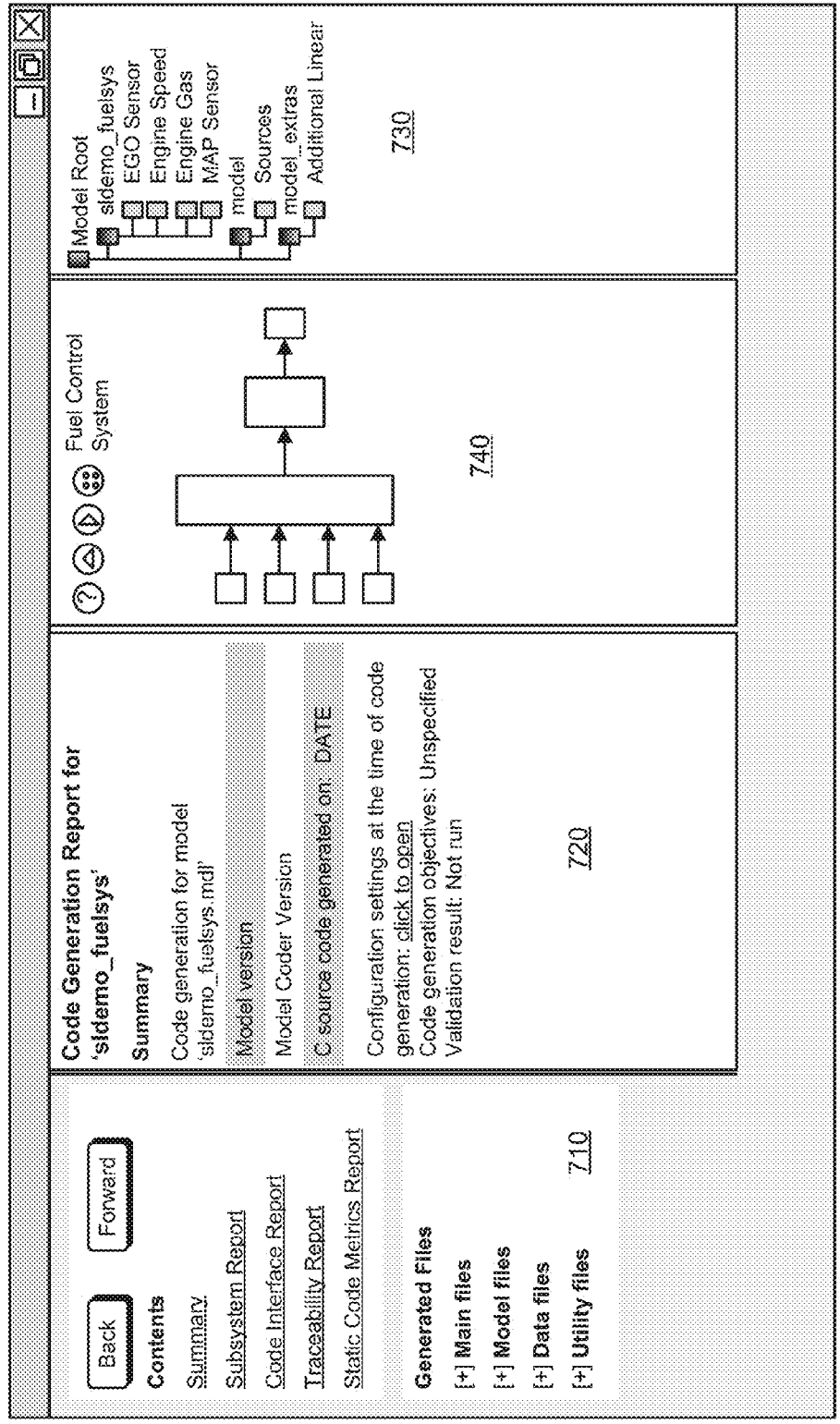

As shown in FIG. 14, user interface 1400 may include a variety of information associated with output file 560. For example, user interface 1400 may include code navigation panel 710, code panel 720, model navigation panel 730, and model panel 740. Code navigation panel 710, code panel 720, model navigation panel 730, and model panel 740 may include the features described above in connection with, for example, one or more of FIGS. 7-13.

As further shown in FIG. 14, user interface 1400 may provide a different layout of panels 710-740 for users with wide screens. For example, user interface 1400 may horizontally align code navigation panel 710, code panel 720, model navigation panel 730, and model panel 740 from left to right. Alternatively, user interface 1400 may horizontally align code navigation panel 710, code panel 720, model navigation panel 730, and model panel 740 in any particular order. Alternatively, user interface 1400 may display one or more panels 710-740 and the user may navigate to non-displayed panels 710-740 by a gesture (e.g., a swipe from left to right or right to left).

Although user interface 1400 depicts a variety of information, in other implementations, user interface 1400 may depict less information, different information, differently arranged information, and/or additional information than depicted in FIG. 14.

Figure 15:
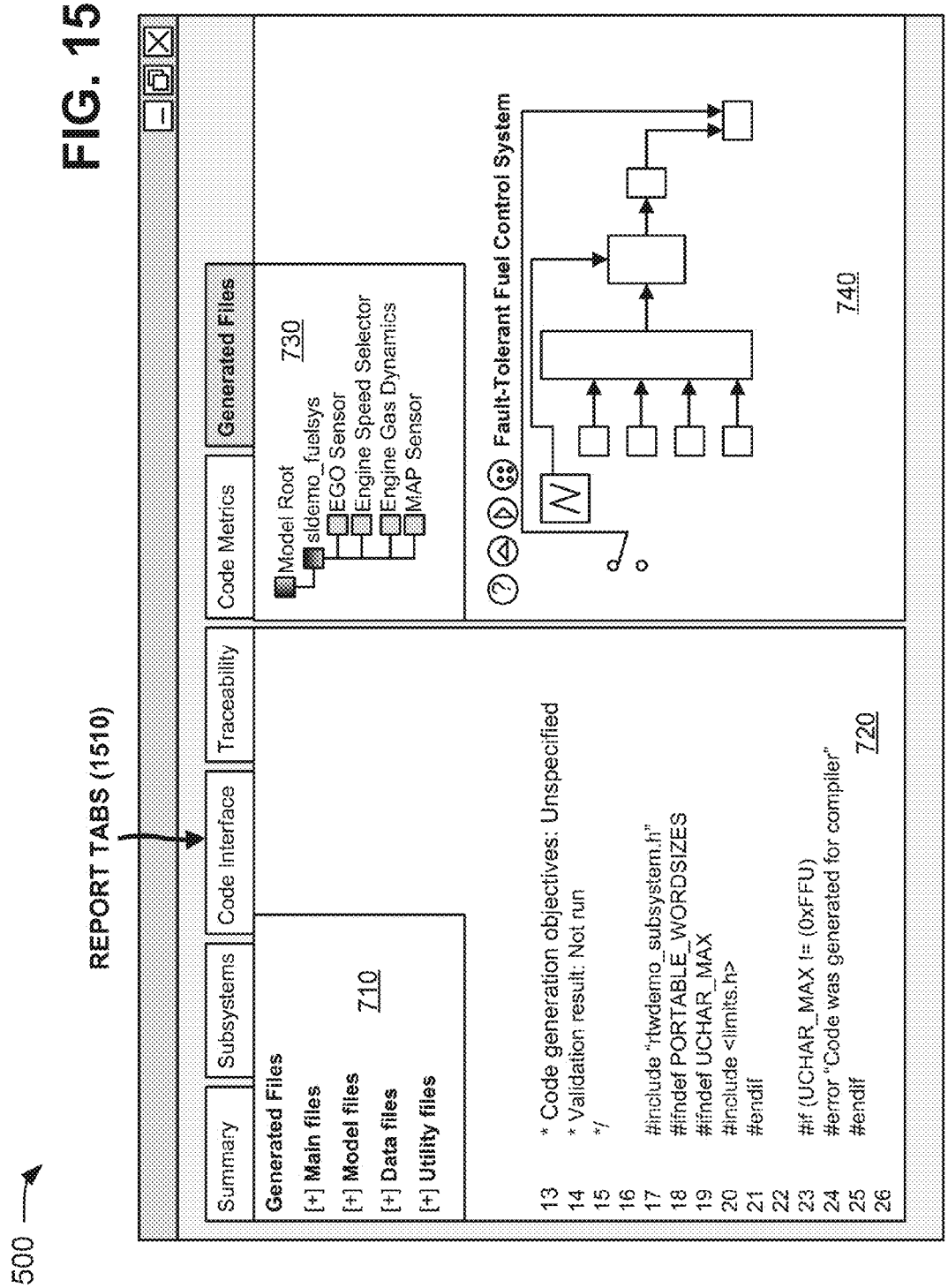

As shown in FIG. 15, user interface 1500 may include a variety of information associated with output file 560. For example, user interface 1500 may include code navigation panel 710, code panel 720, model navigation panel 730, and model panel 740. Code navigation panel 710, code panel 720, model navigation panel 730, and model panel 740 may include the features described above in connection with, for example, one or more of FIGS. 7-14.

As further shown in FIG. 15, user interface 1500 may provide a different layout for panels 710-740. For example, the links to the reports may be removed from code navigation panel 710, and may, instead, be displayed as tabs 1510. Code navigation panel 710 may be provided within code panel 720 (e.g., as a pull-down list) to conserve space. Model navigation panel 730 may be provided within model panel 740 (e.g., as a pull-down list) to conserve space. Code panel 720 and model panel 740 may be arranged in a side-by-side manner.

Although user interface 1500 depicts a variety of information, in other implementations, user interface 1500 may depict less information, different information, differently arranged information, and/or additional information than depicted in FIG. 15.

Example Process

Figure 16:
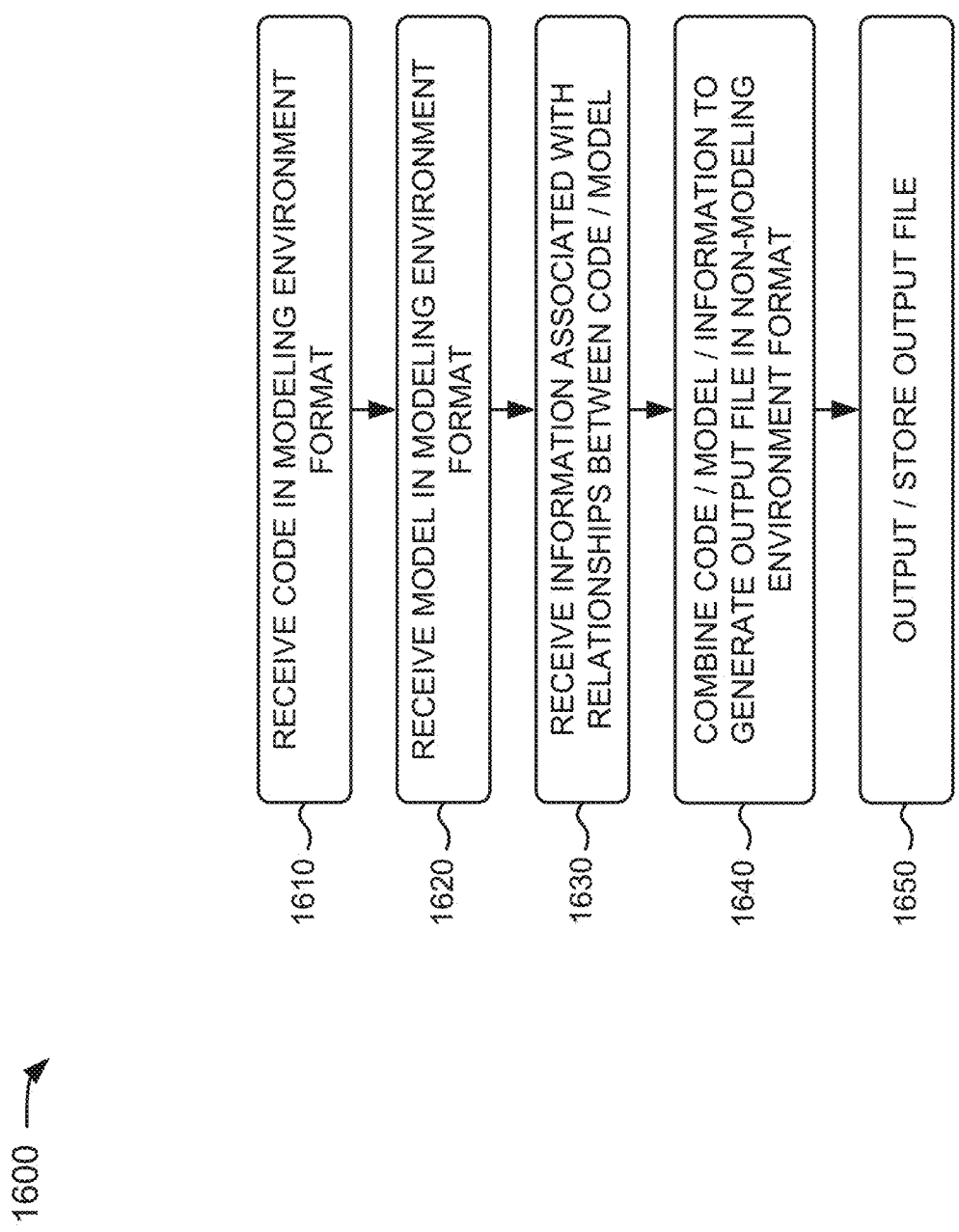
FIGS. 16-18 are flow charts of an example process for transforming modeling environment code/model into a non-modeling environment format.
Figure 17:
Figure 18:
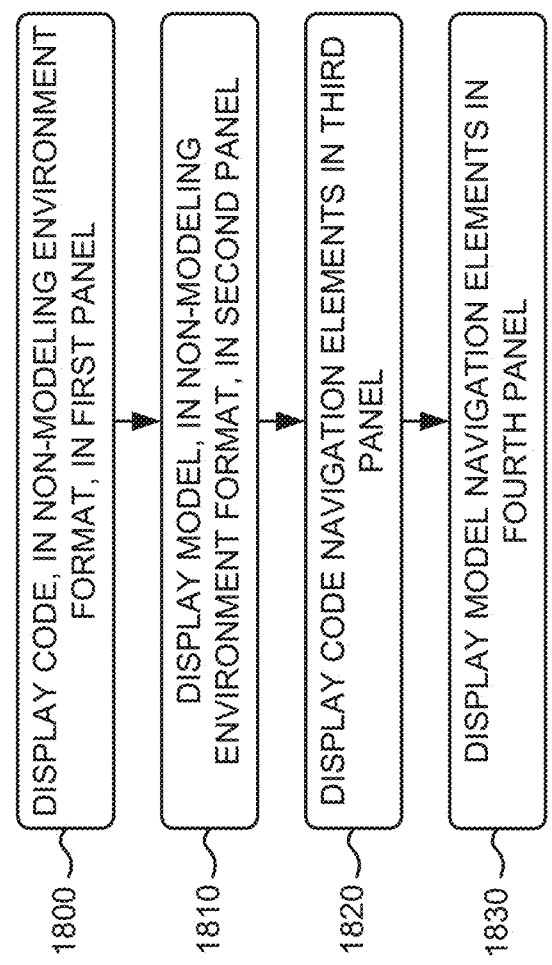

FIGS. 16-18 are flow charts of an example process 1600 for transforming modeling environment code/model into a non-modeling environment format. In one implementation, process 1600 may be performed by client device 210/TCE 240. Alternatively, or additionally, process 1600 may be performed by another device or a group of devices separate from or including client device 210/TCE 240, such as server device 220.

As shown in FIG. 16, process 1600 may include receiving code in a modeling environment format (block 1610), receiving a model in a modeling environment format (block 1620), and receiving information associated with relationships between the code and the model (block 1630). For example, in an implementation described above in connection with FIG. 5, transform component 500 may receive code 510 generated by TCE 240, model 520 generated by TCE 240, and information 530 associated with relationships between TCE code 510 and TCE model 520. TCE code 510 may be in a format that is viewable only within TCE 240 (e.g., a web format, a HTML format, a PDF, etc.), as indicated by reference number 540. TCE model 520 may include a block diagram model with one or more model elements (e.g., blocks), one or more inputs, and one or more outputs. TCE model 520 may be in a format that is viewable only within TCE 240 (e.g., a web format, a HTML format, a PDF, etc.), as indicated by reference number 540. Relationships information 530 may include information identifying: one or more characters in TCE code 510; blocks in TCE model 520; relationships between TCE code 510 and TCE model 520 (e.g., a selection of a block in TCE model 520 may cause corresponding lines of TCE code 510 to be highlighted); mappings between TCE code 510 and TCE model 520 (e.g., a block in TCE model 520 may be mapped to particular portions of TCE code 510); etc.

As further shown in FIG. 16, process 1600 may include combining the code, the model, and the relationships information to generate an output file in a non-modeling environment format (block 1640), and outputting and/or storing the output file (block 1650). For example, in an implementation described above in connection with FIG. 5, transform component 500 may combine (e.g., based on inputs 550) TCE code 510, TCE model 520, and relationships information 530 to generate output file 560 in a non-modeling environment format (e.g., a non-TCE format 570). Transform component 500 may output (e.g., display) and/or store output file 560. In one example, output file 560, when executed, may display a code panel for displaying TCE code 510 (e.g., in non-TCE format 570) and a model panel for displaying TCE model 520 (e.g., in non-TCE format 570). Alternatively, or additionally, output file 560, when executed, may display a code navigation panel that enables a user to navigate TCE code 510 displayed in the code panel, and a model navigation panel that enables a user to navigate TCE model 520 displayed in the model panel.

Process block 1640 may include the process blocks depicted in FIG. 17. As shown in FIG. 17, process block 1640 may include generating a media file from the code (block 1700), generating an interactive graphic file from the model (block 1710), generating a script file from the relationships information (block 1720), and combining the media file, the interactive graphic file, and the script file to generate the output file in the non-modeling environment format (block 1730). For example, in an implementation described above in connection with FIG. 6, media file creator component 600 may receive TCE code 510, and may convert one or more portions of TCE code 510 into media file 640. Interactive graphic file creator component 610 may receive TCE model 520, and may convert one or more portions of TCE model 520 into interactive graphic file 650. Script file creator component 620 may receive relationships information 530, and may convert relationships information 530 into script file 660. Combiner component 630 may receive media file 640, interactive graphic file 650, script file 660, and inputs 550. Combiner component 630 may combine (e.g., based on inputs 550) media file 640, interactive graphic file 650, and script file 660 to generate output file 560 in a non-modeling environment format (e.g., non-TCE format 570).

Process block 1650 may include the process blocks depicted in FIG. 18. As shown in FIG. 18, process block 1650 may include displaying the code, in the non-modeling environment format, in a first panel (block 1800), displaying the model, in the non-modeling environment format, in a second panel (block 1810), displaying code navigation elements in a third panel (block 1820), and displaying model navigation elements in a fourth panel (block 1830). For example, in an implementation described above in connection with FIG. 7, user interface 700 may include code navigation panel 710, code panel 720, model navigation panel 730, and model panel 740. Code navigation panel 710 may enable a user to navigate a representation (e.g., media file 640) of TCE code 510 provided in code panel 720. Code panel 720 may include a representation (e.g., media file 640) of TCE code 510. Model navigation panel 730 may enable a user to navigate a representation (e.g., interactive graphic file 650) of TCE model 520 provided in model panel 740. Model panel 740 may include a representation (e.g., interactive graphic file 650) of TCE model 520.

CONCLUSION

Systems and/or methods described herein may transform modeling environment code and/or a model into a non-modeling environment format file. In one example, the non-modeling environment format file may be viewed in any web browser and may include interrelationships between the code and the model. The non-modeling environment format file may enable a user to view the code, the model, and the interrelationships without the need of a modeling environment, such as a TCE.

The foregoing description of implementations provides illustration and description, but is not intended to be exhaustive or to limit the implementations to the precise form disclosed. Modifications and variations are possible in light of the above teachings or may be acquired from practice of the implementations.

For example, while series of blocks have been described with regard to FIGS. 16-18, the blocks and/or the order of the blocks may be modified in other implementations. Further, non-dependent blocks may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain portions of the implementations may be implemented as a "component" that performs one or more functions. This component may include hardware, such as a processor, an application-specific integrated circuit (ASIC), or a field-programmable gate array (FPGA), or a combination of hardware and software.

Even though particular combinations of features are recited in the claims and/or disclosed in the specification, these combinations are not intended to limit the disclosure of the specification. In fact, many of these features may be combined in ways not specifically recited in the claims and/or disclosed in the specification. Although each dependent claim listed below may directly depend on only one other claim, the disclosure of the specification includes each dependent claim in combination with every other claim in the claim set.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device comprising:
one or more processors to:
receive code in a modeling environment format,
receive a model in the modeling environment format,
receive relationships information associated with one or more relationships between the code and the model,
combine the code, the model, and the relationships information to generate an output file in a non-modeling environment format,
the output file, in the non-modeling environment format, identifying the one or more relationships between the code and the model, and
output or store the output file,
when outputting the output file, the one or more processors are to:
provide the code, in the non-modeling environment format, for display with the model in the non-modeling environment format,
selection of a portion of the code, in the non-modeling environment format, causing a portion of the model, in the non-modeling environment format, to be identified, and
selection of the portion of the model, in the non-modeling environment format, causing the portion of the code, in the non-modeling environment format, to be identified,
the portion of the model, in the non-modeling environment format, corresponding to the portion of the code in the non-modeling environment format.

2. The device of claim 1, where, when combining the code, the model, and the relationships information, the one or more processors are further to:
generate one or more media files from the code,
generate one or more interactive graphic files from the model,
generate a script file from the relationships information, and
combine the one or more media files, the one or more interactive graphic files, and the script file to generate the output file in the non-modeling environment format.

3. The device of claim 1, where, when outputting the output file, the one or more processors are further to:
provide the code, in the non-modeling environment format, for display in a first panel,
provide the model, in the non-modeling environment format, for display in a second panel,
provide code navigation elements for display in a third panel, and
provide model navigation elements for display in a fourth panel.

4. The device of claim 1, where, when outputting the output file, the one or more processors are further to:
provide the code, in the non-modeling environment format, for display in a first panel, and
provide the model, in the non-modeling environment format, for display in a second panel, and
where the one or more processors are further to:
receive the selection of the portion of the code provided for display in the first panel,
provide for display information associated with the selected portion of the code, and
cause the portion of the model to be highlighted in the second panel.

5. The device of claim 1, where, when outputting the output file, the one or more processors are further to:
provide the code, in the non-modeling environment format, for display in a first panel, and
provide the model, in the non-modeling environment format, for display in a second panel, and
where the one or more processors are further to:
receive the selection of the portion of the model provided for display in the second panel,
provide for display information associated with the selected portion of the model, and
cause the portion of the code to be highlighted in the first panel.

6. The device of claim 1, where, when outputting the output file, the one or more processors are further to:
provide the code, in the non-modeling environment format, for display in a first panel, and
provide the model, in the non-modeling environment format, for display in a second panel, and
where the one or more processors are further to:
receive a request to zoom in or out of the model provided for display in the second panel, and
zoom in or out of the model based on the request,
where a degree of zooming in or out of the model is based on an amount of information displayed for the code provided for display in the first panel.

7. The device of claim 1, where, when outputting the output file, the one or more processors are further to:
provide the code, in the non-modeling environment format, for display in a first panel, and
provide the model, in the non-modeling environment format, for display in a second panel, and
where the one or more processors are further to:
receive a request to zoom in or out of the code provided for display in the first panel, and
zoom in or out of the code based on the request,
where a degree of zooming in or out of the code is based on an amount of information displayed for the model provided for display in the second panel.

8. The device of claim 1, where, when outputting the output file, the one or more processors are further to:
provide the code, in the non-modeling environment format, for display in a first panel, and
provide the model, in the non-modeling environment format, for display in a second panel, and
where the one or more processors are further to:
receive comments or notes for the code provided for display in the first panel or the model provided for display in the second panel, and
convert the comments or notes into the modeling environment format.

9. The device of claim 1, where the output file includes one of:
   a first explanation of one of the one or more relationships between the code and the model,
   a second explanation when a portion of the code does not have a relationship with the model, or
   a third explanation when a portion of the model does not have a relationship with the code.

10. The device of claim 1, where the output file permits a user to navigate hierarchies of the code and the model.

11. The device of claim 1, where the one or more processors are further to:
   receive an input identifying a particular portion of the code and a particular portion of the model, and
   combine the particular portion of the code, the particular portion of the model, and the relationships information to generate the output file in the non-modeling environment format.

12. A method, comprising:
   receiving code in a modeling environment format,
      the receiving the code being performed by one or more devices;
   receiving a model in the modeling environment format,
      the receiving the model being performed by the one or more devices;
   receiving relationships information associated with one or more relationships between the code and the model,
      the receiving the relationships information being performed by the one or more devices;
   combining the code, the model, and the relationships information to generate an output file in a non-modeling environment format,
      the combining the code, the model, and the relationships information being performed by the one or more devices; and
   outputting or storing the output file,
      the outputting or storing the output file being performed by the one or more devices,
   the outputting the output file comprising:
      providing the code, in the non-modeling environment format, for display with the model in the non-modeling environment format, the providing enabling:
         a portion of the model, in the non-modeling environment format, to be identified when a portion of the code, in the non-modeling environment format, is selected,
         the portion of the code, in the non-modeling environment format, to be identified when the portion of the model, in the non-modeling environment format, is selected,
         the portion of the model, in the non-modeling environment format, corresponding to the portion of the code in the non-modeling environment format.

13. The method of claim 12, where combining the code, the model, and the relationships information further comprises:
   generating a media file from the code;
   generating an interactive graphic file from the model;
   generating a script file from the relationships information; and
   combining the media file, the interactive graphic file, and the script file to generate the output file in the non-modeling environment format.

14. The method of claim 12, where outputting the output file further comprises at least one of:
   providing the code, in the non-modeling environment format, for display in a first panel;
   providing the model, in the non-modeling environment format, for display in a second panel;
   providing code navigation elements for display in a third panel; or
   providing model navigation elements for display in a fourth panel.

15. The method of claim 12, where outputting the output file further comprises:
   providing the code, in the non-modeling environment format, for display in a first panel; and
   providing the model, in the non-modeling environment format, for display in a second panel,
   the method further comprising:
   receiving selection of the portion of the code provided for display in the first panel;
   providing, for display, information associated with the selected portion of the code; and
   providing, for display in the second panel, the portion of the model,
      the portion of the model, provided for display in the second panel, being highlighted.

16. The method of claim 12, where outputting the output file further comprises:
   providing the code, in the non-modeling environment format, for display in a first panel; and
   providing the model, in the non-modeling environment format, for display in a second panel,
   the method further comprising:
   receiving selection of the portion of the model provided for display in the second panel;
   providing for display information associated with the selected portion of the model; and
   providing, for display in the first panel, the portion of the code, the portion of the code, provided for display in the first panel, being highlighted.

17. The method of claim 12, where outputting the output file further comprises:
   providing the code, in the non-modeling environment format, for display in a first panel; and
   providing the model, in the non-modeling environment format, for display in a second panel,
   the method further comprising:
   receiving a request to zoom in or out of the model provided for display in the second panel; and
   zooming in or out of the model based on the request,
   where a degree of the zooming in or out of the model is based on an amount of information displayed for the code provided for display in the first panel.

18. The method of claim 12, where outputting the output file further comprises:
   providing the code, in the non-modeling environment format, for display in a first panel; and
   providing the model, in the non-modeling environment format, for display in a second panel,
   the method further comprising:
   receiving a request to zoom in or out of the code provided for display in the first panel; and
   zooming in or out of the code based on the request,
   where a degree of the zooming in or out of the code is based on an amount of information displayed for the model provided for display in the second panel.

19. The method of claim 12, where outputting the output file further comprises:
   providing the code, in the non-modeling environment format, for display in a first panel; and
   providing the model, in the non-modeling environment format, for display in a second panel, the method further comprising:
receiving comments or notes for the code provided for display in the first panel or the model provided for display in the second panel; and
converting the comments or notes into the modeling environment format.

20. The method of claim 12, where the output file includes one of:
a first explanation of one of the one or more relationships between the code and the model,
a second explanation when a particular portion of the code does not have a relationship with the model, or
a third explanation when a particular portion of the model does not have a relationship with the code.

21. The method of claim 12, where the output file permits a user to navigate hierarchies of the code and the model.

22. The method of claim 12, further comprising:
receiving an input identifying the portion of the code and the portion of the model; and
combining the portion of the code, the portion of the model, and the relationships information to generate the output file in the non-modeling environment format.

23. One or more non-transitory computer-readable media storing instructions, the instructions comprising:
one or more instructions that, when executed by a processor of a device, cause the processor to:
receive code in a modeling environment format,
receive a model in the modeling environment format,
receive relationships information associated with one or more relationships between the code and the model,
combine the code, the model, and the relationships information to generate an output file in a non-modeling environment format, and
output or store the output file,
the output file, when output displaying the code, in the non-modeling environment format, with the model in the non-modeling environment format,
the output file, in the non-modeling environment format, identifying the one or more relationships between the code and the model,
selection of a portion of the code, in the non-modeling environment format, causing a portion of the model, in the non-modeling environment format, to be identified, and
selection of the portion of the model, in the non-modeling environment format, causing the portion of the code, in the non-modeling environment format, to be identified,
the portion of the model, in the non-modeling environment format, corresponding to the portion of the code in the non-modeling environment format.

24. The one or more non-transitory computer-readable media of claim 23, the instructions further comprising:
one or more instructions that, when executed by the processor, cause the processor to:
generate a media file from the code,
generate an interactive graphic file from the model,
generate a script file from the relationships information, and
combine the media file, the interactive graphic file, and the script file to generate the output file in the non-modeling environment format.

25. The one or more non-transitory computer-readable media of claim 23, the instructions further comprising:
one or more instructions that, when executed by the processor, cause the processor to at least one of:
provide the code, in the non-modeling environment format, for display in a first panel,
provide the model, in the non-modeling environment format, for display in a second panel,
provide code navigation elements for display in a third panel, or
provide model navigation elements for display in a fourth panel.

26. The one or more non-transitory computer-readable media of claim 25, the instructions further comprising:
one or more instructions that, when executed by the processor, cause the processor to:
receive the selection of the portion of the code provided for display in the first panel,
provide, for display, information associated with the selected portion of the code, and cause the portion of the code to be highlighted in the second panel.

27. The one or more non-transitory computer-readable media of claim 25, the instructions further comprising:
one or more instructions that, when executed by the processor, cause the processor to:
receive the selection of the portion of the model provided for display in the second panel,
provide, for display, information associated with the selected portion of the model, and cause the selected portion of the model to be highlighted in the first panel portion of the code corresponding to the selected portion of the model.

28. The one or more non-transitory computer-readable media of claim 25, the instructions further comprising:
one or more instructions that, when executed by the processor, cause the processor to:
receive a request to zoom in or out of the model provided for display in the second panel, and
zoom in or out of the model based on the request,
where a degree of zooming in or out of the model is based on an amount of information displayed for the code provided for display in the first panel.

29. The one or more non-transitory computer-readable media of claim 25, the instructions further comprising:
one or more instructions that, when executed by the processor, cause the processor to:
receive a request to zoom in or out of the code provided for display in the first panel, and
zoom in or out of the code based on the request,
where a degree of zooming in or out of the code is based on an amount of information displayed for the model provided for display in the second panel.

30. The one or more non-transitory computer-readable media of claim 25, the instructions further comprising:
one or more instructions that, when executed by the processor, cause the processor to:
receive comments or notes for the code provided for display in the first panel or the model provided for display in the second panel, and
convert the comments or notes into the modeling environment format.

31. The one or more non-transitory computer-readable media of claim 23, where the output file includes one of:
a first explanation of one of the one or more relationships between the code and the model,
a second explanation when a portion of the code does not have a relationship with the model, or
a third explanation when a portion of the model does not have a relationship with the code.

32. The one or more non-transitory computer-readable media of claim 23, where the output file permits a user to navigate hierarchies of the code and the model.

33. The one or more non-transitory computer-readable media of claim 23, the instructions further comprising:
one or more instructions that, when executed by the processor, cause the processor to:
receive an input identifying a particular portion of the code and a particular portion of the model, and
combine the particular portion of the code, the particular portion of the model, and the relationships information to generate the output file in the non-modeling environment format.

34. A device comprising:
one or more processors to:
receive a model,
process the model, semantically, to generate:
derived information, and
one or more relationships between the model and the derived information, and
store the one or more relationships in a format,
the format enabling a general purpose environment to read the one or more relationships, to navigate between the model and the derived information using the one or more relationships, and to cause at least one of a portion of the model, in the format, being identified when a corresponding portion of the derived information, in the format, is selected or the corresponding portion of the derived information, in the format, to be identified when the portion of the model, in the format, is selected.

35. The device of claim 34, where, when processing the model, the one or more processors are to:
compile the model to one or more of:
infer data types in the model,
order execution of two or more elements of the model, or
infer dimensions in the model.

36. The device of claim 34, where, when processing the model, the one or more processors are to:
optimize the model via one of:
loop unrolling,
inlining,
outlining, or
expression unfolding.

37. The device of claim 34, where the derived information includes one or more of:
code,
simulation results,
coverage results, or
verification results.

38. The device of claim 34, where the general purpose environment includes a web browser.

39. The device of claim 34, where the format enables the general purpose environment to read the one or more relationships and to navigate between the model and the derived information using the one or more relationships, without semantic processing of the model.

* * * * *